United States Patent [19]

Nakajima et al.

[11] Patent Number: 5,184,085
[45] Date of Patent: Feb. 2, 1993

[54] HIGH-VOLTAGE PULSE GENERATING CIRCUIT, AND DISCHARGE-EXCITED LASER AND ACCELERATOR CONTAINING SUCH CIRCUIT

[75] Inventors: Shin Nakajima; Hiroyuki Aoyama; Rihito Kagawa; Osamu Shimoe, all of Kumagaya, Japan

[73] Assignee: Hitachi Metals, Ltd., Tokyo, Japan

[21] Appl. No.: 873,632

[22] Filed: Apr. 22, 1992

Related U.S. Application Data

[63] Continuation of Ser. No. 537,073, Jun. 12, 1990, abandoned.

[30] Foreign Application Priority Data

Jun. 29, 1989 [JP] Japan .................. 1-167365

[51] Int. Cl.$^5$ .................. H03K 3/45; H03K 3/57
[52] U.S. Cl. .................. 328/65; 307/314; 328/67
[58] Field of Search .............. 328/65, 67; 307/314, 307/106

[56] References Cited

U.S. PATENT DOCUMENTS

| 3,015,739 | 1/1962 | Manteuffel . | |
|---|---|---|---|
| 3,174,101 | 3/1965 | Lian | 328/65 |
| 3,181,012 | 4/1965 | Rennie | 328/65 |
| 3,296,551 | 1/1967 | Staples | 328/67 |
| 3,496,476 | 2/1970 | Farrell | 328/67 |
| 3,675,116 | 7/1972 | Israel | 328/67 |
| 3,737,679 | 6/1973 | Cooper | 328/65 |
| 3,928,809 | 12/1975 | Tschudi et al. | 328/67 |
| 4,275,317 | 6/1981 | Laudenslager et al. . | |
| 4,549,091 | 10/1985 | Fahlen et al. | 307/106 |
| 4,684,821 | 8/1987 | Picone et al. | 328/67 |
| 4,730,166 | 3/1988 | Birx et al. | 328/233 |

FOREIGN PATENT DOCUMENTS 0271657 6/1988 European Pat. Off. .
63-171172 7/1988 Japan .
666574 2/1952 United Kingdom .

OTHER PUBLICATIONS

"The Use of Saturable Reactors," W. S. Melville, Proceedings of Institute of Electrical Engineers, (London) vol. 98, Part 3, No. 53, pp. 185-207 (1951).

"Electrical Excitation of an XeCl Laser Using Magnetic Pulse Compression," I. Smilanski, S. R. Byron and T. R. Burkes, Appl. Phys. Lett. 40 (7), pp. 547-548 (1982).

"An Efficient Laser Pulser Using Ferrite Magnetic Switches," H. J. Baker, P. A. Ellsmore and E. C. Sille, J. Phys. E. Sci. Instrument 21 (1988), pp. 218-224.

Primary Examiner—John Zazworsky
Attorney, Agent, or Firm—Finnegan, Henderson, Farabow, Garrett & Dunner

[57] ABSTRACT

A first high-voltage pulse generating circuit comprises a magnetic pulse compression circuit having a main saturable reactor provided with a reset circuit, the reset circuit being provided with a second saturable reactor for providing pulse voltage or current for setting a magnetic flux density of the main saturable reactor at a gate initiation point to a predetermined constant level. A second high-voltage pulse generating circuit comprises a magnetic pulse compression circuit having a main saturable reactor, a preset circuit for magnetizing the main saturable reactor to a saturation region thereof, and a set circuit for setting a magnetic flux density of the main saturable reactor at a gate initiation point to a predetermined constant level.

17 Claims, 22 Drawing Sheets

FIG. 35
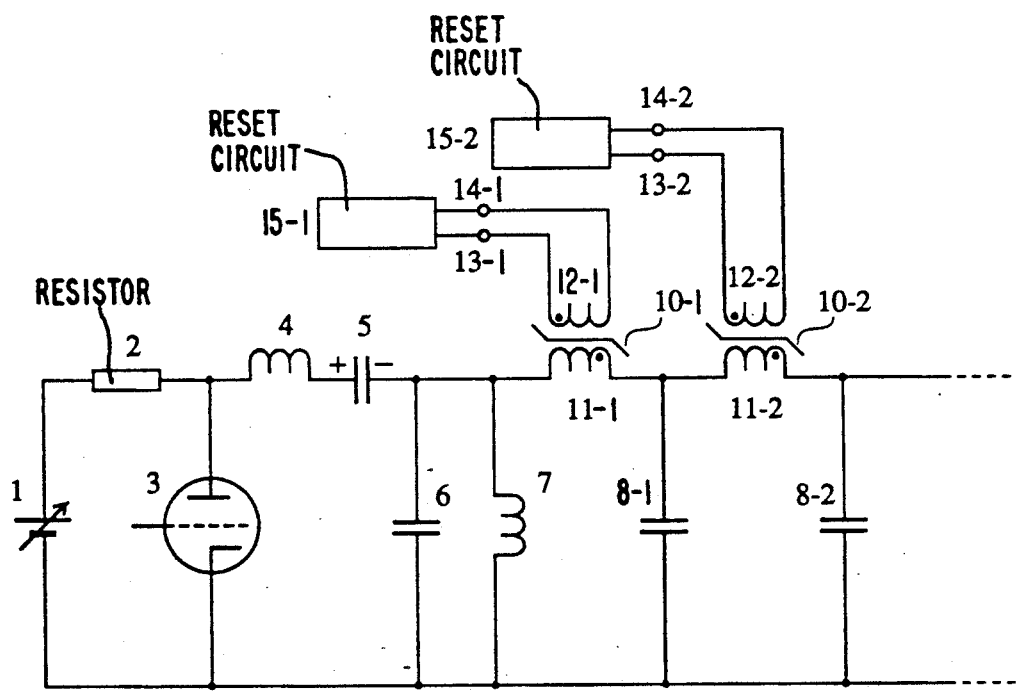
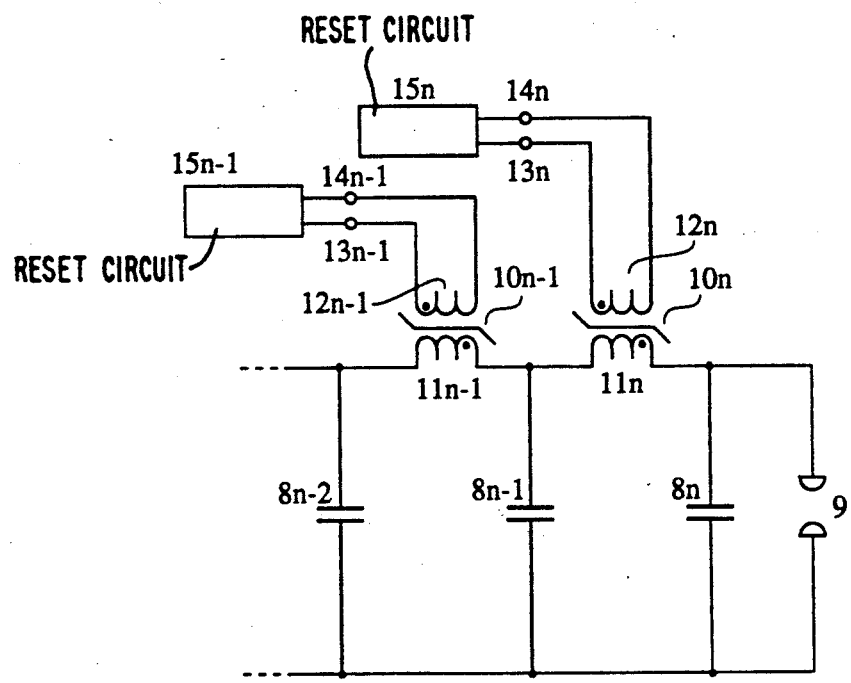

HIGH-VOLTAGE PULSE GENERATING CIRCUIT, AND DISCHARGE-EXCITED LASER AND ACCELERATOR CONTAINING SUCH CIRCUIT

This application is a continuation of application Ser. No. 07/537,073, filed Jun. 12, 1990, now abandoned.

BACKGROUND OF THE INVENTION

The present invention relates to a high-voltage pulse generating circuit for use in discharge-excited lasers such as copper vapor lasers, excimer lasers, etc. and accelerators such as linear induction accelerators, and more particularly to a high-voltage pulse generating circuit comprising a magnetic pulse compression circuit.

Discharge-excited lasers such as copper vapor lasers, excimer lasers, etc. are expected to be used for chemical reaction processes such as uranium enrichment, lithography, CDV, etc.

Such discharge-excited lasers are required to have high output, high pulse-repetition rate, high reliabilty and long service life. For achieving these requirements, a high-voltage pulse generating circuit as shown in FIG. 24 is used. This high-voltage pulse generating circuit 24 comprises a variable high-voltage dc power supply 1, a resistor 2 for charging a main capacitor 5, a thyratron 3, an inductor 4, a capacitor 6, a peaking capacitor 8, main laser discharge electrodes 9, a main saturable reactor 10, and an inductor 81 for charging the main capacitor 5.

Explanation will be made referring to FIGS. 24, 25 and 28 on the operation of this circuit when parameters of the constituent elements are optimized such that an energy transmission efficiency from the main capacitor 5 to the peaking capacitor 8 is maximum.

In the turn-off period of the thyratron 3, the main saturable reactor 10 is reset from a point "$e_8$" to $-B_r$ via a point "$a_8$" in FIG. 25, by a magnetizing force generated by current for charging the main capacitor 5 which flows through a course from a plus terminal of the dc power supply 1 to the resistor 2, the inductor 4, the main capacitor 5, the winding 11 of the main saturable reactor 10, the inductor 81 and a minus terminal of the dc power supply 1. In this circuit, a circuit for charging the main capacitor 5 serves also as a reset circuit for the main saturable reactor 10.

Next, when the thyratron 3 is turned on at $t=0$ in FIG. 28, terminal voltage $v_6$ of the capacitor 6 increases, as shown in FIG. 28 (a), in the polarity shown in FIG. 24, by discharge current $i_1$ shown in FIG. 28 (b) which flows through a course from a plus terminal of the main capacitor 5, to the inductor 4, the thyratron 3, the capacitor 6 and a minus terminal of the main capacitor 5. During this period, the magnetic flux density of the main saturable reactor 10 changes from $-B_r$ toward a point "$b_8$" in FIG. 25. At this time, since the main saturable reactor 10 has an extremely large inductance $L_{10}$, current $i_2$ flowing through a course from the capacitor 6 to the capacitor 8, the winding 11 of the main saturable reactor 10 and the capacitor 6 is much smaller than the current $i_1$ as shown in FIG. 28 (e). Thus, the main saturable reactor 10 is in a turn-off state equivalently. Therefore, as shown in FIG. 28 (c), the main saturable reactor 10 blocks the voltage in a polarity shown in FIG. 24.

When the current $i_1$ becomes zero at $t=\tau_1$, the magnetic flux density of the main saturable reactor 10 reaches a point "$b_8$" in FIG. 25, so that a magnetic core of the main saturable reactor 10 is saturated. At this time, the main saturable reactor 10 has inductance $L_{10}$ (sat.) sufficiently smaller than the inductance $L_4$ of the inductor 4, so that most of charges stored in the capacitor 6 flow as current $i_2$ in the direction shown in FIG. 24. As shown in FIG. 28 (e), $i_2$ drastically increases, so that the magnetic flux density of the main saturable reactor 10 changes from a point "$b_8$" to a point "$B_r$" via a point "$c_8$" in FIG. 25. Accordingly, energy stored in the capacitor 6 is mostly transmitted to the peaking capacitor 8 as shown in FIG. 28 (discharge-excited laser).

Incidentally, a period from a time at which the thyratron 3 is turned on, to a time at which the current $i_2$ becomes zero is called a "gate period." Assuming that each element suffers from no loss, $$\int_0^{\tau_1} v_6 \cdot dt \approx \frac{E \cdot \tau_1}{2} \tag{1}$$

$$\int_0^{\tau_1} v_{11} \cdot dt = N_{11} \cdot A_e \cdot \Delta B_m \tag{2}$$

Assuming $v_6 \approx v_{11}$, $$\frac{E \cdot \tau_1}{2} \approx N_{11} \cdot A_e \cdot \Delta B_m \tag{3}$$

$$\Delta B_m \approx B_S - (-B_r) \tag{4}$$

$$\tau_1 \approx \pi \sqrt{\frac{L_4 \cdot C_5 \cdot C_6}{C_5 + C_6}} \tag{5}$$

$$\tau_2 \approx \pi \sqrt{\frac{L_{10(sat)} \cdot C_6 \cdot C_8}{C_6 + C_8}} \tag{6}$$

$$H_{LM} = \frac{N_{11} \cdot I_{2m}}{l_e} \tag{7}$$

E: Input dc power supply voltage (V).
$N_{11}$: Number of winding of coil 11 of main saturable reactor 10.
$A_e$: Effective cross section ($m^2$) of main saturable reactor 10.
$\Delta B_m$: Operating magnetic flux density (T) of main saturable reactor 10.
$B_S$: Saturation magnetic flux density (T) of main saturable reactor 10.
$B_r$: Residual magnetic flux density (T) of main saturable reactor 10 in the saturation region.
$L_4$: Inductance (H) of inductor 4.
$L_{10(sat)}$: Inductance (H) of main saturable reactor 10.
$C_5$: Capacitance (F) of main capacitor 5.
$C_6$: Capacitance (F) of capacitor 6.
$C_8$: Capacitance (F) of peaking capacitor 8.
$H_{LM}$: Wave height (A/m) of gate magnetizing force of main saturable reactor 10.
$I_{2m}$: Wave height (A) of $i_2$.
$l_e$: Mean magnetic path length (m) of main saturable reactor 10.

As soon as all the energy of the capacitor 6 is transmitted to the peaking capacitor 8, the main laser discharge electrodes 9 are broken down at a time of $\tau_1+\tau_2$ shown in FIG. 28, so that the energy of the peaking capacitor 8 is consumed in a laser gas. At this time, although most energy accumulated in the peaking capacitor 8 is consumed in a laser gas via the main laser discharge electrodes 9, a part of the energy is used to reset the main saturable reactor 10. By this energy, the magnetic flux density of the main saturable reactor 10 changes from a point "Br" to a point "e₈" via a point "d₈" in FIG. 25.

The above operation is usually repeated at a predetermined pulse-repetition rate.

When the current discharged from the main capacitor 5 is smaller than current necessary for generating a full-reset magnetizing force Hr (determined by operation conditions) of the magnetic core of the main saturable reactor 10, a reset circuit 85 may be added, as shown in FIG. 26, to reset the main saturable reactor 10. The reset circuit 85 is connected to terminals 83, 84 of a reset winding 82 for the main saturable reactor 10, to reset the main saturable reactor 10 to an opposite magnetization direction as shown by the dot shown in FIG. 26. The details of the reset circuit 85 are described in Japanese Patent Laid-Open No. 63-171172, etc. FIG. 27 shows an example of the reset circuit 85 having output terminals 83, 84. The reset circuit 85 comprises an inductor 86 for blocking a high-voltage surge induced in the reset winding 82 of the main saturable reactor 10 during the gate period, a resistor 87, a varistor 88 and a dc power supply 89.

In the above conventional circuit, there is one magnetic pulse compression circuit comprising a saturable reactor, but some high-voltage pulse generating circuits comprise semiconductor elements such as thyristors instead of thyratrons as switching elements, and multistage magnetic pulse compression circuits consisting of a plurality of magnetic pulse compression circuits each comprising a saturable reactor. Also, in the case of accelerators such as linear induction accelerators, high-voltage pulse generating circuits comprising multistage magnetic pulse compression circuits are mostly used because large output is required.

Incidentally, the principle of a magnetic pulse compression circuit is described in "The Use of Saturable Reactors As Discharge Devices for Pulse Generators," W. S. Melville, Proceedings of Institute of Electrical Engineers, (London) Vol. 98, Part 3, No. 53, pp. 185-207 (1951); the application of such circuit to discharge-excited lasers is described in "Electrical Excitation of an XeCl Laser Using Magnetic Pulse Compression," I. Smilanski, S. R. Byron and T. R. Burkes, Appl. Phys. Lett. 40 (7), pp. 547-548 (1982); the magnetic pulse compression circuit using semiconductor elements is described in U.S. Pat. No. 4,549,091, and "An Efficient Laser Pulser Using Ferrite Magnetic Switches," H. J. Baker, P. A. Ellsmore and E. C. Sille, J. Phys. E. Sci. Instrument 21 (1988), pp. 218-224.

Also, in accelerators such as linear induction accelerators for free electron lasers, etc., high-voltage pulse generating circuits having the same system as described above may be used. The details are described, for instance, in D. Birx, E. Cook, S. Hawkins, S. Poor, L. Reginato, J. Schmidt and M. Smith: "The Application of Magnetic Switches as Pulse Sources for Induction Linacs," IEEE Transactions on Nuclear Science, Vol. NS-30, No. 4, pp. 2763-2768 (1983), and U.S. Pat. No. 4,730,166.

In discharge-excited lasers, the stabilization of laser output and the reduction of jitter are required. For instance, in excimer lasers for lithography, it is necessary to stably supply a laser output of about 100 mJ per one pulse for a period of $10^8$ shots or more in a pulse-repetition rate of about 500 Hz. However, since a laser gas is deteriorated by repeated operation, it is necessary to gradually increase an energy to be supplied to the laser gas, in order to satisfy the above output requirements. For this purpose, in the conventional circuit shown in FIG. 24, the input dc power supply voltage is gradually increased. In the circuit shown in FIG. 24, since the operating magnetic flux density ($\Delta B_m$ expressed by the formula (4)) of the main saturable reactor 10 in a gate period is constant, voltage and current at main elements in the circuit have waveforms shown in FIG. 29, when the input dc power supply voltage is lower than an optimum value at which the energy transmission efficiency from the main capacitor 5 to the peaking capacitor 8 is maximum. On the other hand, when the input dc power supply voltage is higher than the above optimum value, the voltage and current waveforms become as shown in FIG. 30. In both cases, the energy transmission efficiency from the main capacitor 5 to the peaking capacitor 8 decreases, and after-current of the current $i_1$ flowing between main electrodes of the thyratron 3 increases, causing inverse current to flow. As a result, the loss of the thyratron 3 increases. Further, since a percentage of energy which does not contribute to the laser oscillation increases in the laser gas, the service life of the laser gas decreases. Therefore, the number of shots by which a constant laser output can be obtained is limited to about $10^6$ or less.

In the copper vapor lasers used in a uranium enrichment process, stable, continuous operation is required at a pulse-repetition rate of about 5 kHz or more and at a laser output of about 100 W with a jitter of ±3 nanoseconds or less for about 1000 hours or more. Since such lasers are operated at a pulse-repetition rate about one order higher than that of the excimer laser, it is strongly desired to use a high-voltage pulse generating circuit comprising a multistage magnetic pulse compression circuit and semiconductor elements such as thyristors instead of thyratrons as switching elements. However, in the conventional high-voltage pulse generating circuit utilizing a multistage magnetic pulse compression circuit, to optimize the energy transmission efficiency from the main capacitor to the peaking capacitor at a final stage, a pulse width of current flowing after the saturation of the saturable reactor should be adjusted. For this purpose, an inductor is inserted in series to a saturable reactor in each magnetic pulse compression circuit. This is because the operating magnetic flux density of the saturable reactor constituting each magnetic pulse compression circuit in a gate period is constant as $\Delta B_m$ in the above formula (4). In addition, the above procedure should be utilized in the adjustment of the magnetic pulse compression circuit in the synchronous operation of a plurality of high-voltage pulse generating circuits, so that it is extremely difficult to use such system in commercial plants needing the synchronous operation of a plurality of high-voltage pulse generating circuits.

In free electron lasers or linear induction accelerators used for plasma heating of nuclear fusion plants, a kind of transformer for accelerating electron beams, which is called "accelerator cell," should be supplied with rectangular pulses having a voltage wave height of several hundreds of kV, a current wave height of several tens of kA and a pulse width of about 100 nanoseconds, with jitter within several nanoseconds at a pulse-repetition rate of several kHz or more in a burst mode for as long a period of time as possible. In the high-voltage pulse generating circuit in these applications, a multistage magnetic pulse compression circuit comprising thyratrons as switching elements in parallel is used. In this high-voltage pulse generating circuit, there is a problem that the energy transmission efficiency decreases as the operation time passes, since the operating magnetic flux density of the magnetic core of the saturable reactor in a gate period decreases by repeated operation because of temperature rise caused by the loss of the saturable reactor.

OBJECTS AND SUMMARY OF THE INVENTION

Accordingly, an object of the present invention is to provide a high-voltage pulse generating circuit capable of being operated at a high pulse-repetition rate with high reliability without suffering from the decrease in energy transmission efficiency, the increase in switching element loss and the generation of output jitter even when the variation of characteristics of each element such as input power supply voltage variation, load variation, etc. takes place.

Another object of the present invention is to provide a discharge-excited laser comprising such a high-voltage pulse generating circuit.

A further object of the present invention is to provide an accelerator comprising such a high-voltage pulse generating circuit.

Thus, the high-voltage pulse generating circuit according to one embodiment of the present invention comprises a magnetic pulse compression circuit having a main saturable reactor provided with a reset circuit, the reset circuit being provided with a second saturable reactor for providing the main saturable reactor with pulse voltage or current for setting a magnetic flux density of the main saturable reactor at a gate initiation point to a predetermined constant level.

The high-voltage pulse generating circuit according to another embodiment of the present invention comprises a magnetic pulse compression circuit having a main saturable reactor, a preset circuit for magnetizing the main saturable reactor to a saturation region thereof, and a set circuit for setting a magnetic flux density of the main saturable reactor at a gate initiation point to a predetermined constant level.

The discharge-excited laser according to the present invention comprises either one of the above-mentioned high-voltage pulse generating circuits.

The accelerator according to the present invention comprises either one of the above-mentioned high-voltage pulse generating circuits.

BRIEF DESCRIPTION OF THE DRAWINGS

FIG. 35 is a schematic view showing a high-voltage pulse generating circuit according to another embodiment of the invention.

DETAILED DESCRIPTION OF THE INVENTION

Figure 1:
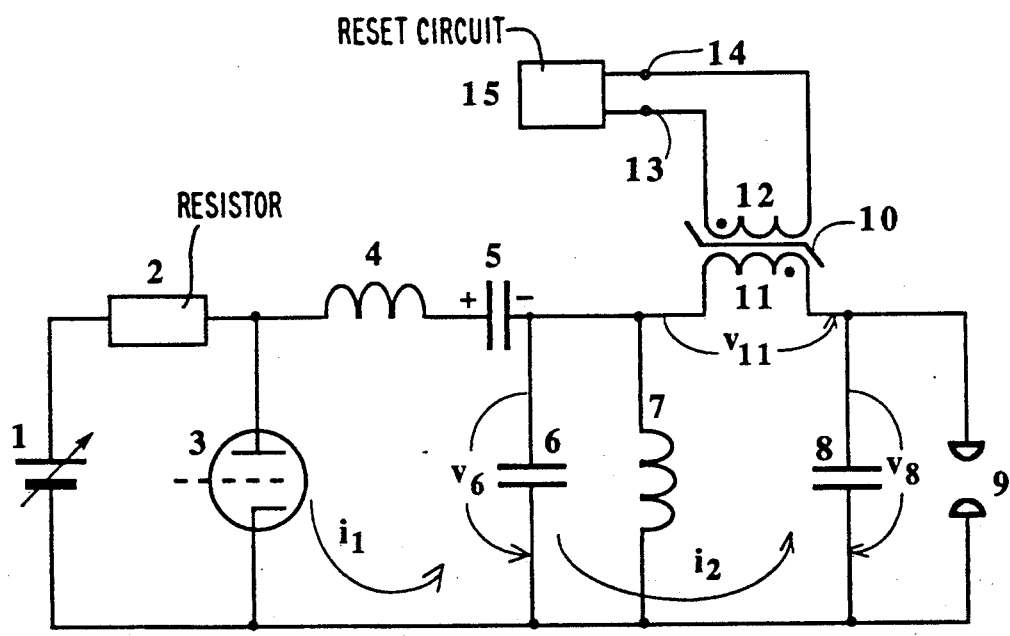
FIG. 1 is a schematic view showing the high-voltage pulse generating circuit according to one embodiment of the present invention.

The present invention provides a high-voltage pulse generating circuit comprising a magnetic pulse compression circuit having a main saturable reactor provided with a reset circuit, the reset circuit being provided with a second saturable reactor for providing pulse voltage or current for setting a magnetic flux density of the main saturable reactor at a gate initiation point to a predetermined constant level.

In the above high-voltage pulse generating circuit, when the operating magnetic flux density of the main saturable reactor in the gate period is adjusted depending upon load variation, input voltage variation and the variation of characteristics of constituent elements, etc., by pulse voltage or current applied via a second saturable reactor contained in a reset circuit constituting the magnetic pulse compression circuit, surge voltage induced in the main saturable reactor can be blocked by the second saturable reactor disposed in the reset circuit, thereby protecting a pulse-generating circuit in the reset circuit from the surge voltage. Also, as compared with a reset circuit containing a usual reactor, the reset circuit having a saturable reactor is advantageous both in surge voltage-blocking function and in reset response in the high-repetition operation of the high-voltage pulse generating circuit.

When there is a sufficient interval for completing a self-setting action of the main saturable reactor between a period during which gate voltage is applied to the main saturable reactor of the magnetic pulse compression circuit and a period during which the reset circuit generates pulse voltage or current, the surge voltage is more effectively blocked by the second saturable reactor disposed in the reset circuit.

When the second saturable reactor disposed in the reset circuit is provided with a reset circuit for resetting the second saturable reactor, the operating magnetic flux density due to the surge voltage can be increased, thereby achieving the miniaturization of the second saturable reactor. In addition, since the operating magnetic flux density can be kept constant in a period in which switch elements in the reset circuit for the second saturable reactor disposed in the reset circuit are operated, output jitter can be reduced.

The present invention also provides a high-voltage pulse generating circuit comprising a magnetic pulse compression circuit in which a main saturable reactor is provided with a preset circuit for magnetizing the main saturable reactor to its saturation region, and a set circuit for setting a magnetic flux density of the main saturable reactor at a gate initiation point to a predetermined constant level.

Because of the preset and set circuits disposed in the main saturable reactor constituting the magnetic pulse compression circuit, the fluctuation of the magnetic flux density of the main saturable reactor at the gate initiation point due to load variation, etc. of the high-voltage pulse generating circuit can be eliminated, thereby suppressing the jitter of magnetic flux density. Also, the output jitter of the high-voltage pulse generating circuit, which would, if otherwise, occur in adjusting the operating magnetic flux density of the main saturable reactor in the gate period, can preferably be reduced.

By pulse voltage or current generated by the preset circuit or the set circuit constituting the magnetic pulse compression circuit, the response characteristics of output control by the main saturable reactor constituting the magnetic pulse compression circuit can be improved in the high-repetition operation.

By presetting and setting the main saturable reactor constituting the magnetic pulse compression circuit by pulse voltage or current applied via the presetting or setting saturable reactor disposed in the preset circuit or the set circuit, the preset circuit can be well protected from the surge voltage induced in the main saturable reactor in the gate period.

By providing a presetting saturable reactor disposed in the preset circuit of the main saturable reactor of the magnetic pulse compression circuit with a reset circuit for setting a magnetic flux density of the presetting saturable reactor at a gate initiation point thereof to a predetermined constant level, a magnetic core constituting the presetting saturable reactor can be miniaturized and the output jitter of the high-voltage pulse generating circuit can be reduced.

In the magnetic pulse compression circuit comprising the main saturable reactor provided with the set circuit and the preset circuit, the preset circuit can be operated such that the main saturable reactor is magnetized to a saturation region on the same side as in the gate period to prevent the jitter of magnetic flux density just before the setting of the main saturable reactor, and then the set circuit can be operated to set a magnetic flux density of the main saturable reactor at a gate initiation point to a predetermined constant level, so that the jitter of magnetic flux density after setting is reduced. As a result, the operating magnetic flux density of the main saturable reactor in the gate period can be set while suppressing the jitter.

By setting the maximum magnetic flux density of the main saturable reactor at the time of presetting higher than the residual magnetic flux density, the output jitter of the high-voltage pulse generating circuit can be reduced.

Further, by setting the maximum magnetic flux density of the main saturable reactor at the time of presetting such that the specific permeability of the main saturable reactor is within a range of 10 or less, the output jitter of the high-voltage pulse generating circuit can be extremely reduced.

In the high-voltage pulse generating circuit comprising the magnetic pulse compression circuit having the main saturable reactor provided with the set circuit and the preset circuit, by magnetizing the main saturable reactor by the preset circuit to a saturation region on an opposite side to the saturation region in the gate period in which the jitter of magnetic flux density of the main saturable reactor is small, and then operating the set circuit to magnetize the main saturable reactor in the same direction as that in the gate period, thereby setting a magnetic flux density of the main saturable reactor at a gate initiation point to a predetermined constant level, the jitter can be suppressed in the setting the operating magnetic flux density of the main saturable reactor in the gate period.

In the high-voltage pulse generating circuit comprising the magnetic pulse compression circuit having the main saturable reactor whose operating magnetic flux density in the gate period is set by a setting operation after a presetting operation, by setting the minimum magnetic flux density of the main saturable reactor at the time of presetting lower than the negative residual magnetic flux density, the output jitter of the high-voltage pulse generating circuit can be greatly reduced.

In the high-voltage pulse generating circuit, by changing the operating magnetic flux density of the main saturable reactor in the gate period depending on the input dc power supply voltage or the load variation, the deterioration of energy transmission efficiency can be extremely suppressed while providing variable output.

When a plurality of magnetic pulse compression circuits are used, optimization can be easily achieved to maximize the energy transmission efficiency while preventing extreme deterioration of the energy transmission efficiency.

When a plurality of the high-voltage pulse generating circuits are operated synchronously, the timing of synchronous operation of each high-voltage pulse generating circuit can be easily determined because each high-voltage pulse generating circuit suffers from little output jitter.

A discharge-excited laser comprising the above-mentioned high-voltage pulse generating circuit suffers from little reduction of energy transmission efficiency even when the input dc power supply voltage is changed to prevent the reduction of laser output due to laser gas deterioration, etc. Thus, it enjoys an improved function of providing a constant laser output.

When the discharge-excited laser is an excimer laser, the input dc power supply voltage should be changed widely to increase as much as possible the number of shots at which a constant laser output can be obtained, because the laser gas deterioration is extremely fast. However, according to the present invention, since the high-voltage pulse generating circuit can be operated such that the energy transmission efficiency is always optimized for varied input voltage, the number of shots at which a constant laser output can be obtained can be increased by one order or more.

When the discharge-excited laser is a copper vapor laser, a plurality of lasers are arranged in tandem and operated synchronously in most cases. According to the present invention, the total output of the lasers operated synchronously can be easily increased because the output jitter of each laser can be minimized.

When the above-mentioned high-voltage pulse generating circuit is used as an accelerator for charged particles such as electron beams, the output control can be easily conducted without suffering from drastic decrease in energy transmission efficiency, and with little jitter.

When the above accelerator is a linear induction-type accelerator, it is easy to control the output variation which may occur by the variation of characteristics of the saturable reactor, the transformer, etc., which takes place due to heat generation by their repeated operation.

In the above-mentioned high-voltage pulse generating circuit comprising a saturable reactor-containing magnetic pulse compression circuit, a magnetic core of the main saturable reactor is preferably made of a magnetic material having a saturation magnetostriction $\lambda s$ between $+5 \times 10^{-6}$ and $-5 \times 10^{-6}$, to reduce the output jitter when a repetition frequency is changed. As a result, the deterioration of magnetic properties of the magnetic core can be effectively prevented, resulting in an excellent high-voltage pulse generating circuit with high reliability.

The magnetic core of the main saturable reactor is preferably made of a Co-base amorphous magnetic alloy to reduce the output jitter. Such Co-base amorphous magnetic alloy may have any known composition, as long as it has high permeability and small magnetostriction.

Also, the magnetic core of the main saturable reactor is preferably made of an Fe-base, fine crystalline, magnetic alloy having the general formula:

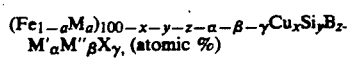

$M'_\alpha M''_\beta X_\gamma$, (atomic %)

wherein M is Co and/or Ni, M' is at least one element selected from the group consisting of Nb, W, Ta, Zr, Hf, Ti and Mo, M" is at least one element selected from the group consisting of V, Cr, Mn, Al, elements in the platinum group, Sc, Y, rare earth elements, Au, Zn, Sn and Re, X is at least one element selected from the group consisting of C, Ge, P, Ga, Sb, In, Be and As, and a, x, y, z, $\alpha$, $\beta$ and $\gamma$ respectively satisfy $0 \leq a \leq 0.5$, $0.1 \leq x \leq 3$, $6 \leq y \leq 25$, $3 \leq z \leq 15$, $14 \leq y+z \leq 30$, $1 \leq \alpha \leq 10$, $0 \leq \beta \leq 10$ and $0 \leq \gamma \leq 10$, at least 50% of the alloy structure being fine crystalline particles of a bcc solid solution having an average particle size of 500Å or less when measured by a maximum size of each crystalline particle. When such an Fe-base, fine crystalline, magnetic alloy is used, the output jitter can be prevented. Such a Fe-base, fine crystalline, magnetic alloy is fully described in EP 0271657.

The present invention will be described in detail referring to the attached drawings.

FIG. 1 shows a high-voltage pulse generating circuit according to one embodiment of the present invention. The high-voltage pulse generating circuit comprises a variable high-voltage dc power supply 1, a resistor 2 for charging a main capacitor 5, a thyratron 3, an inductor 4, a capacitor 6, an inductor 7 for charging the main capacitor 5, a peaking capacitor 8, main laser discharge electrodes 9, a main saturable reactor 10, an output winding 11 of the main saturable reactor 10, a reset winding 12 of the main saturable reactor 10, and a reset circuit 15 for the main saturable reactor 10.

Figure 2:
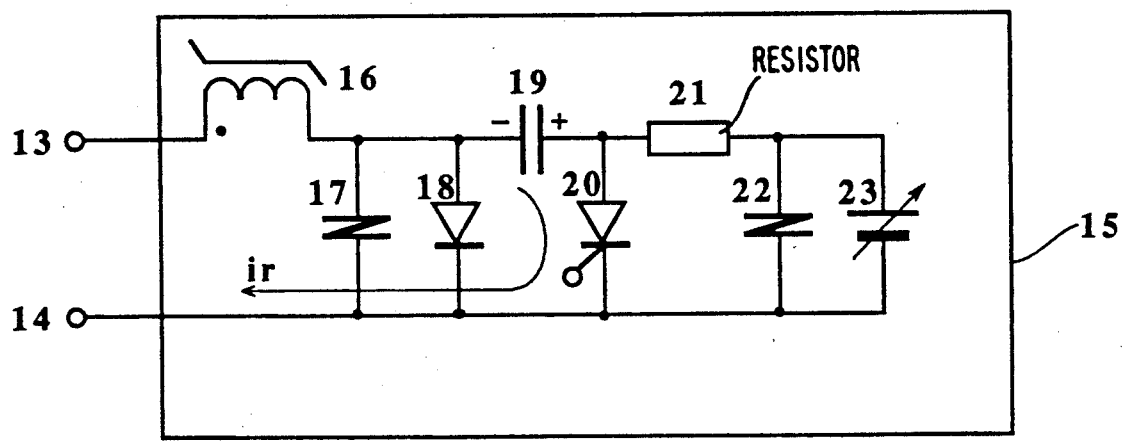
FIG. 2 is a schematic view showing the reset circuit for use in the high-voltage pulse generating circuit according to one embodiment of the present invention.

FIG. 2 shows a reset circuit 15 used in the high-voltage pulse generating circuit according to one embodiment of the present invention, which comprises output terminals 13, 14, a second saturable reactor 16, varistors 17, 22 for absorbing surge voltage, a diode 18, a capacitor 19, a thyristor 20, a resistor 21, and a variable-voltage dc power supply 23.

The operation of this high-voltage pulse generating circuit of FIG. 1 containing the reset circuit 15 of FIG. 2 will be explained referring to FIGS. 1-5.

Figure 3:
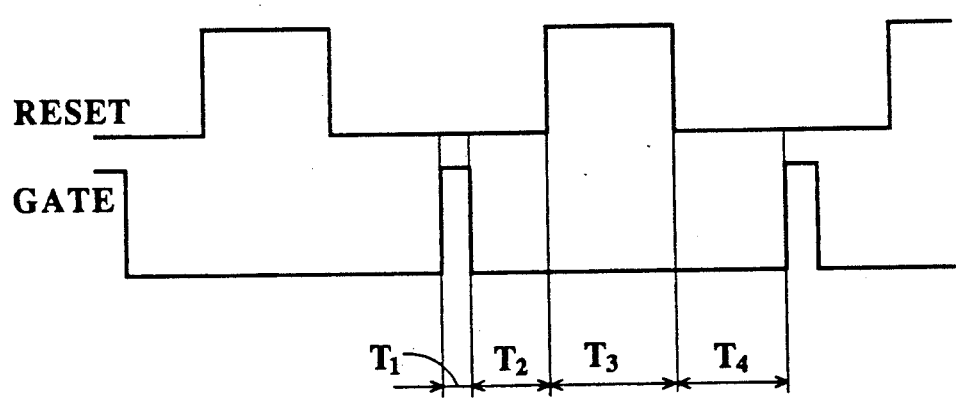
FIG. 3 is a timing chart of the high-voltage pulse generating circuit shown in FIG. 1.

During a period $T_1$ shown in FIG. 3, namely during a gate period, the thyratron 3 is turned on, so that charges stored in the main capacitor 5 in the polarity shown in the figure are transferred to the capacitor 6 along the course of discharge current $i_1$ shown in the figure. During this period, the magnetic flux density of the main saturable reactor 10 changes from a point "$a_1$" toward a point "$b_1$," but the discharge current $i_2$ from the capacitor 6 to the peaking capacitor 8 is extremely small because the output winding 11 of the main saturable reactor 10 has an extremely large inductance. Accordingly, most of the terminal voltage $v_6$ of the capacitor 6 is applied to the output winding 11 of the main saturable reactor 10 in the polarity shown by the dot in FIG. 1. Also during this period, the thyristor 20 of the reset circuit 15 shown in FIG. 2 is in a turn-off state, so that the magnetic flux density of the second saturable reactor 16 changes from a point "$a_2$" toward a point "$b_2$" in FIG. 5 in the polarity shown by the dot in FIG. 2 due to surge voltage induced in the reset winding 12 in the polarity shown by the dot, depending upon the waveform of the voltage blocked by the output winding 11 of the main saturable reactor 10. At this time, since the second saturable reactor 16 has a sufficiently large inductance, the surge voltage induced in the reset winding of the main saturable reactor 10 is mostly blocked by the second saturable reactor 16, so that the diode 18, the thyristor 20, the variable-voltage dc power supply 23, etc. are protected.

Figure 4:
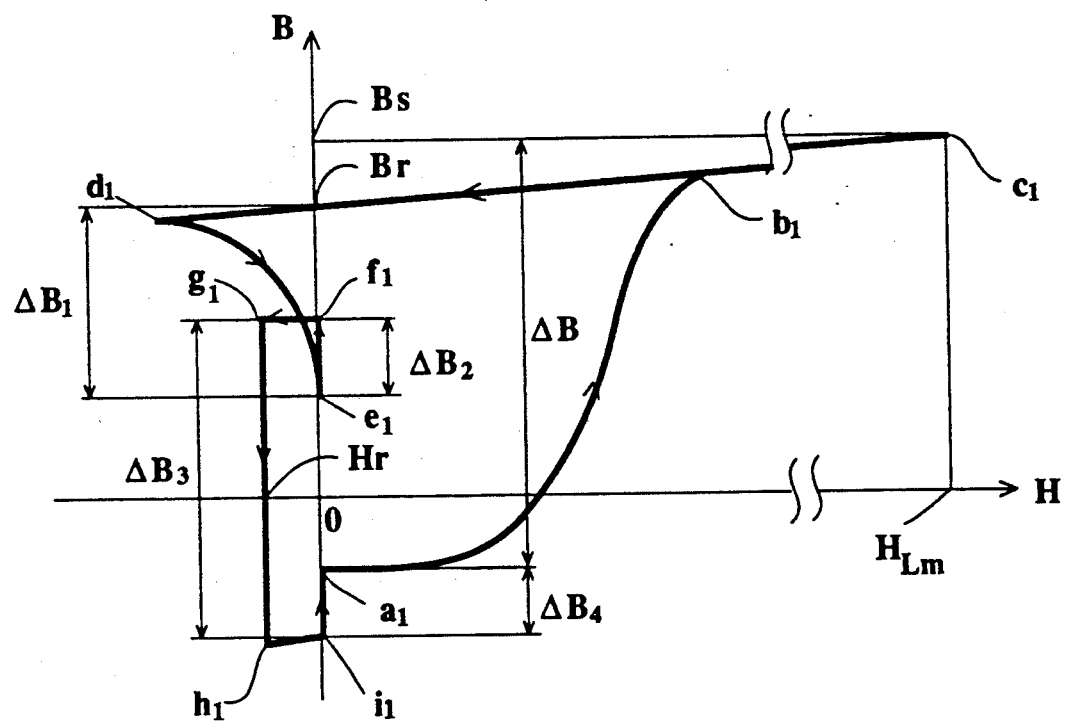
FIG. 4 is a graph schematically showing the operating magnetization curve of the main saturable reactor 10 in the high-voltage pulse generating circuit shown in FIG. 1.
Figure 5:
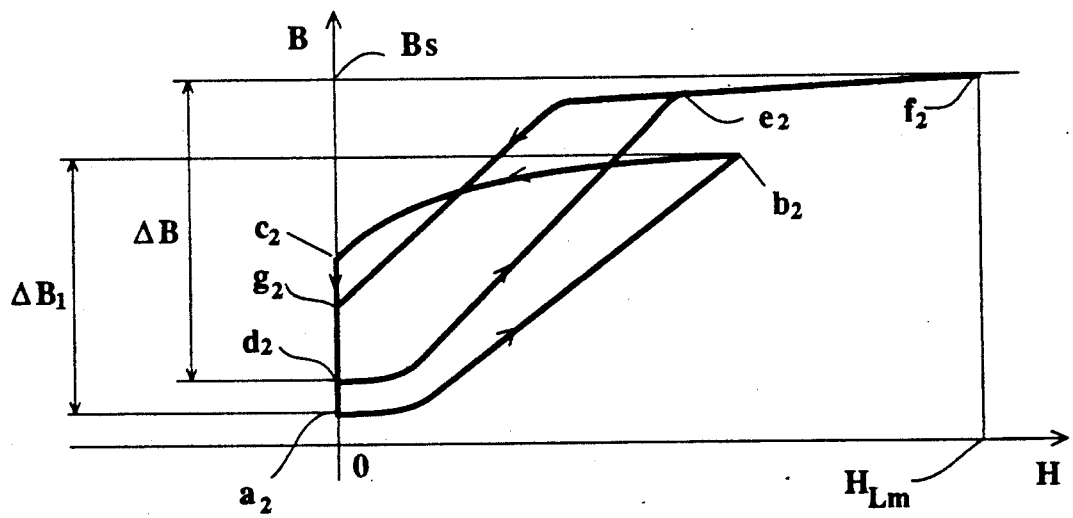
FIG. 5 is a graph schematically showing the operating magnetization curve of the second saturable reactor 16 in the reset circuit 15 shown in FIG. 2.

As soon as the energy of the main capacitor 5 is mostly transferred to the capacitor 6, the magnetic flux density of the main saturable reactor 10 is saturated at a point "$b_1$" in FIG. 4. As a result, the inductance of the output winding 11 of the main saturable reactor 10 drastically decreases, and the current $i_2$ greatly increases, so that the energy of the capacitor 6 is transferred to the peaking capacitor 8.

Incidentally, the term "saturated" or "saturation" used herein means that the inductance of the saturable reactor becomes sufficiently small so that current applied to the saturable reactor is not substantially blocked. When the saturable reactor falls in this state, it may be said that it enters into a "saturation region." For instance, in FIG. 4, a region between a point "$b_1$" and a point "$c_1$" is the saturation region.

When the terminal voltage $v_8$ of the peaking capacitor 8 reaches a breakdown voltage of the main laser discharge electrodes 9, most of the energy stored in the peaking capacitor 8 is consumed in a laser gas via the main laser discharge electrodes 9, contributing to laser oscillation. However, part of the energy contributes to the reset of the main saturable reactor 10 without being consumed in the laser gas. During this period, the thyristor 20 of the reset circuit 15 shown in FIG. 2 is in a turn-off state. Accordingly, the magnetic flux density of the main saturable reactor 10 changes from a point "$b_1$" to a point "$e_1$" via points "$c_1$" and "$d_1$" in FIG. 4. Also, the magnetic flux density of the second saturable reactor 16 changes from a point "$b_2$" to a point "$d_2$" via a point "$c_2$" in FIG. 5. In FIG. 4, $\Delta B$ means an operating magnetic flux density in a gate period, and $\Delta B_1$ means an operating magnetic flux density due to inverse current $i_1$.

During a period $T_2$ shown in FIG. 3, both the thyratron 3 and the thyristor 20 are in a turn-off state. During this period, the main capacitor 5 is charged again in the polarity shown in FIG. 1 by charge current flowing through a course from a plus terminal of the power supply 1, the resistor 2, the inductor 4, the main capacitor 5, the inductor 7 and a minus terminal of the power supply 1. Also, the magnetic flux density of the main saturable reactor 10 changes by $\Delta B_2$ from a point "$e_1$" to a point "$f_1$" in FIG. 4 due to a self-setting operation. The magnetic flux density of the second saturable reactor 16 also changes by a self-resetting operation from a point "$c_2$" to a point "$d_2$" in FIG. 5. The self-setting operation of the main saturable reactor 10 and that of the second saturable reactor 16 may differ depending upon the materials of the magnetic cores used. With respect to the self-setting operation of the main saturable reactor 10, please refer to Kiwaki, Onda, "Experimental Consideration on Operation of Magnetic Core of High-Frequency Magnetic Amplifier for DC-DC Converter," Magnetics Research Institute of the Electric Association, MAG-88-233, pp. 1-8 (1988).

During a period $T_3$ shown in FIG. 3, namely during a reset period, the thyristor 20 is turned on, so that charges stored in the capacitor 19 in the polarity shown in the figure are discharged along the course of discharge current $i_r$ shown in the figure. During this period, the thyratron 3 is in a turn-off state. The magnetic flux density of the second saturable reactor 16 changes from a point "$d_2$" to a point "$e_2$" in FIG. 5, entering into the saturation region. After saturation, it changes to a point "$g_2$." Since the second saturable reactor 16 has a sufficiently large inductance in a period between the point "$d_2$" and the point "$e_2$," the current $i_r$ is extremely small, so that the turn-off loss of the thyristor 20 is sufficiently blocked. After saturation at "$e_2$," the inductance of the second saturable reactor 16 drastically decreases, so that the current $i_r$ extremely increases. The current $i_r$ flows through the reset winding 12 of the main saturable reactor 10, thereby magnetizing it in the polarity shown by the dot in FIG. 1. Thus, resetting is conducted. As a result, the magnetic flux density of the main saturable reactor 10 changes by $\Delta B_3$ from a point "$f_1$" to a point "$i_1$" via points "$g_1$" and "$h_1$" in FIG. 4.

During a period $T_4$ shown in FIG. 3, both the thyratron 3 and the thyristor 20 are in a turn-off state. During this period, the magnetic flux density of the main saturable reactor 10 changes by $\Delta B_4$ from a point "$i_1$" to a point "$a_1$" in FIG. 4 due to a self-setting operation. The magnetic flux density of the second saturable reactor 16 also changes by a self-setting operation from a point "$g_2$" to a point "$a_2$" in FIG. 5. This period $T_4$ is necessary to make sure that the magnetic flux density of the main saturable reactor at the gate initiation point is set at a predetermined constant level ("a").

The above operation is repeated.

In this embodiment, when the voltage of the input power supply 1 changes, pulse voltage applied to the reset winding 12 of the main saturable reactor 10 can be changed by changing the voltage of the variable-voltage dc power supply 23 of the reset circuit 15, to control the operating magnetic flux density ΔB of the main saturable reactor 10 in the gate period, thereby always keeping the energy transmission efficiency from the main capacitor 5 to the peaking capacitor 8 optimum. As a result, the high-voltage pulse generating circuit of the present invention suffers from much smaller reduction of energy transmission efficiency due to the input voltage variation than the conventional high-voltage pulse generating circuit.

In addition, by adding the second saturable reactor 16 to the reset circuit 15, the non-saturation region of the second saturable reactor 16 is utilized to provide a sufficiently large inductance to block surge voltage induced in the reset winding 12 of the main saturable reactor 10 in the gate period, and the saturation region of the second saturable reactor is utilized to provide a sufficiently small inductance, thereby sufficiently reducing the pulse width of the pulse voltage at the time of resetting in the second saturable reactor 16. As a result, it is possible to shorten the reset period and to protect the reset circuit in the pulse voltage or current resetting system, thereby making it easier to operate the magnetic pulse compression circuit at a high repetition rate.

As described above, when a plurality of magnetic pulse compression circuits are used, optimization can be easily achieved to maximize energy transmission efficiency. FIG. 35 illustrates a high-voltage pulse generating circuit according to an embodiment of the invention in which a plurality of magnetic pulse compression circuits each having a main saturable reactor are included. The circuit in FIG. 35 includes elements common to the circuit of FIG. 1 as identified by like reference numerals. However, unlike the circuit illustrated in FIG. 1, the circuit in FIG. 35 includes a plurality of n-main saturable reactors 10-$i$ each including an output winding 11-$i$, a reset winding 12-$i$, and a reset circuit 15-$i$ having output terminals 13-$i$ and 14-$i$.

Figure 6:
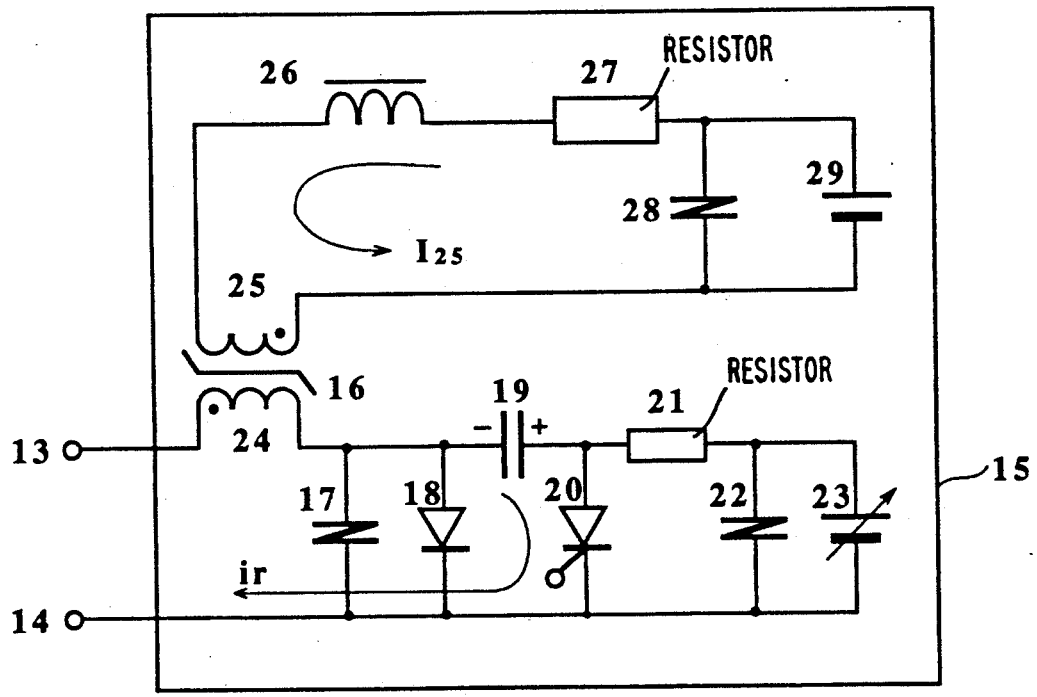
FIG. 6 is a schematic view showing the reset circuit 15 for use in the high-voltage pulse generating circuit according to another embodiment of the present invention.

FIG. 6 shows a reset circuit 15 used in the high-voltage pulse generating circuit shown in FIG. 1 for a discharge-excited laser according to another embodiment of the present invention. The reset circuit 15 comprises output terminals 13, 14, a second saturable reactor 16, varistors 17, 22, 28 for absorbing surge voltage, a diode 18, a capacitor 19, a thyristor 20, resistors 21, 27, a variable-voltage dc power supply 23, an output winding 24 of the second saturable reactor 16, a reset winding 25 of the second saturable reactor 16, an inductor 26 for absorbing surge voltage, and a dc power supply 29. The high-voltage pulse generating circuit and the reset circuit 15 in this embodiment are essentially the same as in the first embodiment with respect to operation and timing chart of the main circuit of FIG. 1, except for the operation of the second saturable reactor 16 in the reset circuit 15.

The operation of the second saturable reactor 16 in the reset circuit 15 in this embodiment will be explained referring to FIGS. 3 and 6-7.

During a period $T_1$ shown in FIG. 3, namely during a gate period of the main saturable reactor 10, surge voltage induced in the reset winding 12 of the main saturable reactor 10 is applied to the output winding 24 of the second saturable reactor 16. As a result, the magnetic flux density of the second saturable reactor 16 changes from a point "$a_3$" to a point "$b_3$" by $\Delta B_1$ in FIG. 7 in the polarity shown by the dot in FIG. 6. At this time, since the output winding 24 of the second saturable reactor 16 has a sufficiently large inductance at $b_3$, the surge voltage is mostly blocked by the output winding 24 of the second saturable reactor 16, so that the diode 18, the thyristor 20, the variable-voltage dc power supply 23, etc. are protected. Incidentally, the magnetic flux density of the second saturable reactor 16 then spontaneously changes from a point "$b_3$" to a point "$c_3$."

During a period $T_2$ shown in FIG. 3, both the thyratron 3 and the thyristor 20 are in a turn-off state. During this period, the magnetic flux density of the second saturable reactor 16 is reset from a point "$c_3$" to a point "$a_3$" in FIG. 7 in the opposite polarity to the dot shown in FIG. 6 due to current $I_{25}$ flowing through the reset winding 25 of the second saturable reactor 16.

During a period $T_3$ shown in FIG. 3, the thyristor 20 is turned on, so that charges stored in the capacitor 19 in the polarity shown in the figure are discharged along the course of discharge current $i_r$ shown in the figure. As a result, the magnetic flux density of the second saturable reactor 16 changes from a point "$a_3$" to a point "$f_3$" by $\Delta B_2$ via points "$d_3$" and "$e_3$" in FIG. 7 in the polarity shown by the dot in FIG. 6. During this period, since the output winding 24 of the second saturable reactor 16 has a sufficiently large inductance, voltage induced by the turn-on of the thyristor 20 is mostly blocked by the output winding 24. However, at "$d_3$," the inductance of the output winding 24 of the second saturable reactor 16 drastically decreases, so that pulse voltage is applied to the reset winding 12 of the main saturable reactor 10. Thus, resetting of the main saturable reactor 10 is conducted in the opposite polarity to the dot shown in FIG. 1.

Figure 7:
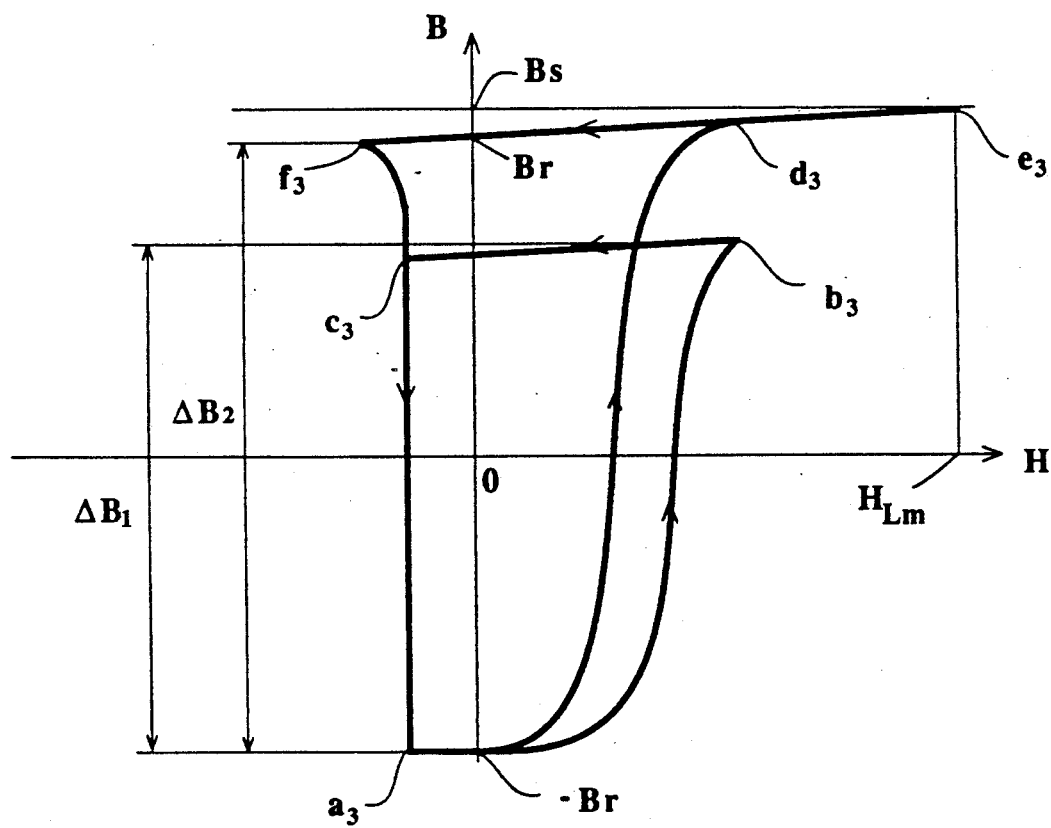
FIG. 7 is a graph schematically showing the operating magnetization curve of the second saturable reactor 16 in the reset circuit 15 shown in FIG. 6.

During a period $T_4$ shown in FIG. 3, the magnetic flux density of the second saturable reactor 16 changes from a point "$f_3$" to a point "$a_3$" in FIG. 7 by reset current flowing through the reset winding 25.

The above operation is repeated.

In this embodiment, when the voltage of the input power supply 1 changes, the operating magnetic flux density of the main saturable reactor 10 in the gate period can be controlled by changing the voltage of the variable-voltage dc power supply 23 of the reset circuit 15, thereby always keeping the optimum operation of the high-voltage pulse generating circuit.

By adding the second saturable reactor 16 to the reset circuit 15, the same effects as mentioned above in connection with the reset circuit 15 of FIG. 2 can be obtained. Further, by adding a new reset circuit to the second saturable reactor 16, the operating magnetic flux density of the second saturable reactor 16 can be increased, thereby achieving the miniaturization of magnetic cores of the second saturable reactor 16.

Figure 8:
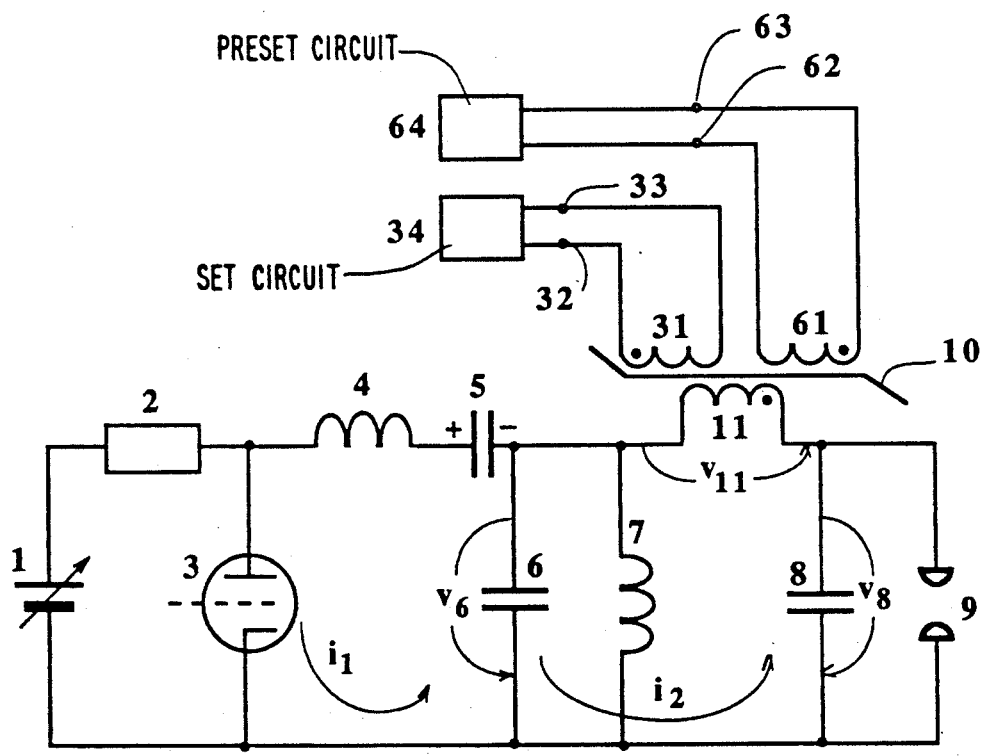
FIG. 8 is a schematic view showing the high-voltage pulse generating circuit according to another embodiment of the present invention.

FIG. 8 shows a high-voltage pulse generating circuit used for a discharge-excited laser according to a further embodiment of the present invention. This high-voltage pulse generating circuit comprises a variable high-voltage dc power supply 1, a resistor 2 for charging a main capacitor 5, a thyratron 3, an inductor 4, a capacitor 6, an inductor 7 for charging the main capacitor 6, a peaking capacitor 8, main laser discharge electrodes 9, a main saturable reactor 10, an output winding 11 of the main saturable reactor 10, a set winding 31 for the main saturable reactor 10, a preset winding 61 for the main saturable reactor 10, a set circuit 34 having output terminals 32, 33 connected to terminals of the set winding 31 of the main saturable reactor 10, and a preset circuit 64 having output terminals 62, 63 connected to terminals of the preset winding 61 of the main saturable reactor 10.

Figure 9:
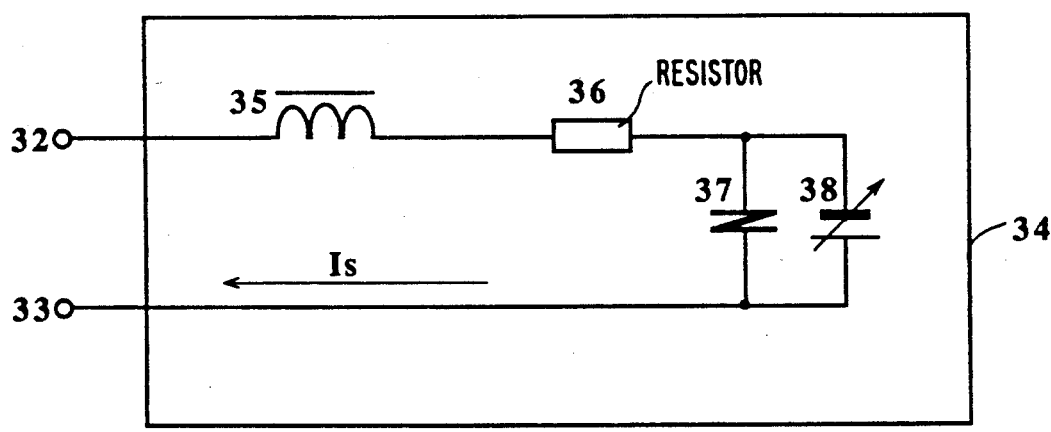
FIG. 9 is a schematic view showing the set circuit 34 for use in the high-voltage pulse generating circuit according to another embodiment of the present invention.

FIG. 9 shows a set circuit 34 used in the high-voltage pulse generating circuit of FIG. 8 according to a further embodiment of the present invention, which comprises an inductor 35 for absorbing surge voltage, a resistor 36, a varistor 37 for absorbing surge voltage, and a variable-voltage dc power supply 38.

Figure 10:
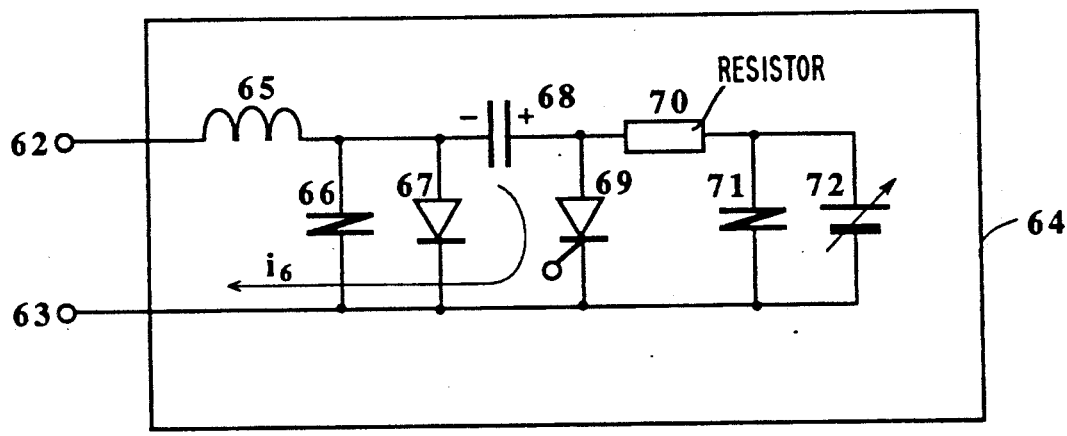
FIG. 10 is a schematic view showing the preset circuit 64 for use in the high-voltage pulse generating circuit according to one embodiment of the present invention.

FIG. 10 shows a preset circuit 64 used in the high-voltage pulse generating circuit of FIG. 8, which comprises an inductor 65, varistors 66, 71 for absorbing surge voltage, a diode 67, a capacitor 68, a thyristor 69, a resistor 70 and a variable-voltage dc power supply 72.

The operation of the circuit shown in FIG. 8 will be explained referring to FIGS. 8–12.

Figure 11:
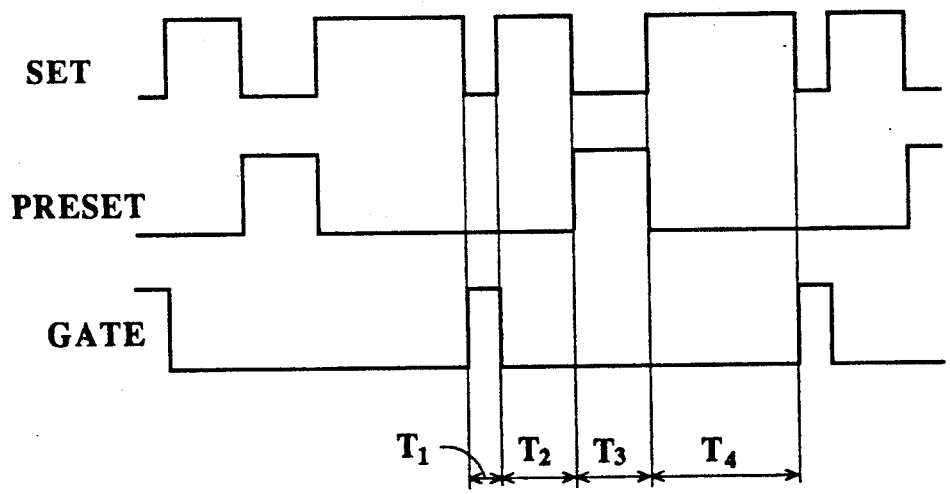
FIG. 11 is a timing chart of the high-voltage pulse generating circuit shown in FIG. 8.

During a period $T_1$ shown in FIG. 11, namely during a gate period, the thyratron 3 is turned on, so that charges stored in the main capacitor 5 in the polarity shown in the figure are transferred to the capacitor 6 along the course of discharge current $i_1$ shown in the figure. During this period, the magnetic flux density of the main saturable reactor 10 changes from a point "$a_4$" toward a point "$b_4$" in FIG. 12, but the discharge current $i_2$ from the capacitor 6 to the peaking capacitor 8 is extremely small because the output winding 11 of the main saturable reactor 10 has an extremely large inductance. Accordingly, most of the terminal voltage $v_6$ of the capacitor 6 is applied to the output winding 11 of the main saturable reactor 10 in the polarity shown by the dot in FIG. 8. On the other hand, during this period, the thyristor 69 of the preset circuit 64 shown in FIG. 10 is in a turn-off state, and dc set current $I_s$ flows through the set circuit 34. However, since the gate magnetizing force is larger than the magnetizing force $H_r$ due to dc set current $I_s$ applied to the main saturable reactor 10, the magnetic flux density of the main saturable reactor 10 changes from a point "$a_4$" toward a point "$b_4$" in FIG. 12 as mentioned above. At this time, surge voltage is induced in the preset winding 61 and the set winding 31 of the main saturable reactor 10 in the polarities shown by the dots in FIG. 8, but it is absorbed by the inductors 65, 35, thereby protecting semiconductor elements, dc power supplies, etc.

Figure 12:
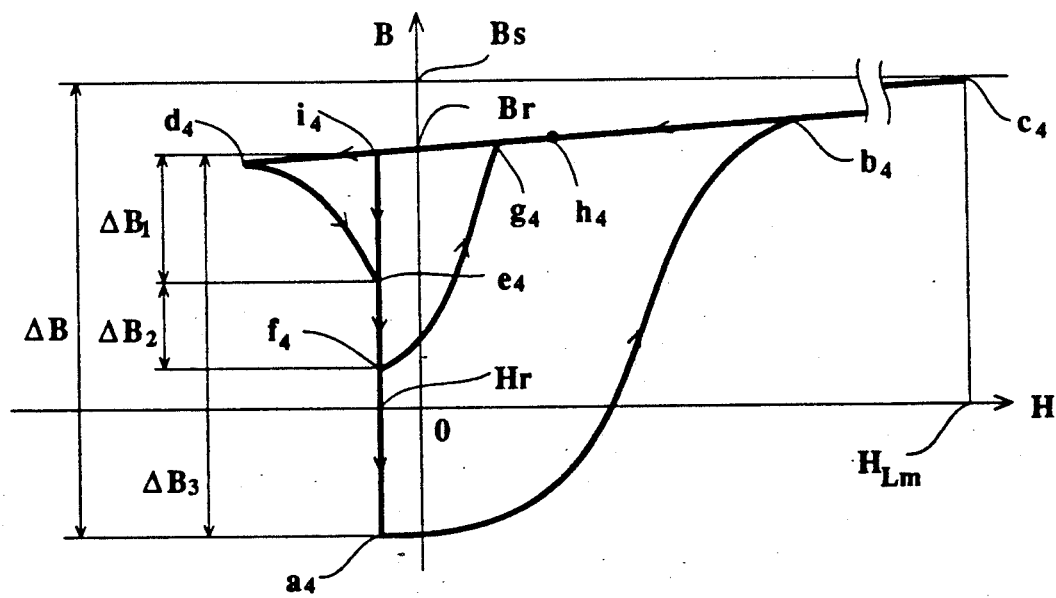
FIG. 12 is a graph schematically showing the operating magnetization curve of the main saturable reactor 10 in the high-voltage pulse generating circuit shown in FIG. 8.

As soon as the energy of the main capacitor 5 is mostly transferred to the capacitor 6, the magnetic flux density of the main saturable reactor 10 is saturated at a point "$b_4$" in FIG. 12. As a result, the inductance of the output winding 11 of the main saturable reactor 10 drastically decreases, and the current $i_2$ extremely increases, so that the energy of the capacitor 6 is transferred to the peaking capacitor 8. When the terminal voltage $v_8$ of the peaking capacitor 8 reaches a breakdown voltage of the main laser discharge electrodes 9, most of the energy stored in the peaking capacitor 8 is consumed in a laser gas via the main laser discharge electrodes 9, contributing to laser oscillation. However, part of the energy contributes to setting of the main saturable reactor 10 without being consumed in the laser gas. The magnetic flux density of the main saturable reactor 10 changes from a point "$b_4$" to a point "$e_4$" via points "$c_4$" and "$d_4$" in FIG. 12. Incidentally, in FIG. 12, $\Delta B$ means an operating magnetic flux density in a gate period, and $\Delta B_1$ means an operating magnetic flux density due to inverse current $i_2$.

During a period $T_2$ shown in FIG. 11, both the thyratron 3 and the thyristor 69 are in a turn-off state. During this period, the magnetic flux density of the main saturable reactor 10 changes by $\Delta B_2$ from a point "$e_4$" to a point "$f_4$" in FIG. 12 due to the set current $I_s$ supplied to the set circuit 34. Thus, the setting of the main saturable reactor 10 is conducted.

During a period $T_3$ shown in FIG. 11, the thyristor 69 is turned on, so that charges stored in the capacitor 68 in the polarity shown in the figure are discharged along the course of discharge current $i_{61}$ shown in the figure, and supplied to the preset winding 61 of the main saturable reactor 10, thereby magnetizing it in the polarity shown by the dot in FIG. 8. As a result, the magnetic flux density of the main saturable reactor 10 changes from a point "$f_4$" to a point "$i_4$" via points "$g_4$" and "$h_4$" in FIG. 12 by substantially $(\Delta B_1 + \Delta B_2)$ determined by magnetization $H_r$ due to the set current $I_s$. Thus, the presetting of the main saturable reactor 10 is achieved.

During a period $T_4$ shown in FIG. 11, the thyristor 69 is in a turn-off state. During this period, the magnetic flux density of the main saturable reactor 10 changes by $\Delta B_3$ from a point "$i_4$" to a point "$a_4$" in FIG. 12 due to the set current $I_s$. Thus, the setting of the main saturable reactor 10 can be achieved.

The above operation is repeated.

In this embodiment, the presetting operation in the period $T_3$ in FIG. 11 can compensate the variation of operating magnetic flux density $(\Delta B_1 + \Delta B_2)$ of the main saturable reactor 10 in the periods $T_1$ and $T_2$ in FIG. 11, which inevitably occur due to the variations of laser gas discharge conditions such as gas composition, gas pressure, gas flow rate, gas temperature, energy supplied, etc.

To prevent the reduction of energy transmission efficiency when there is variation in input dc power supply voltage, it is possible to control the operating magnetic flux density $\Delta B$ of the main saturable reactor 10 in the gate period by changing the set current $I_s$ flowing through the set winding 31 of the main saturable reactor 10.

Figure 13:
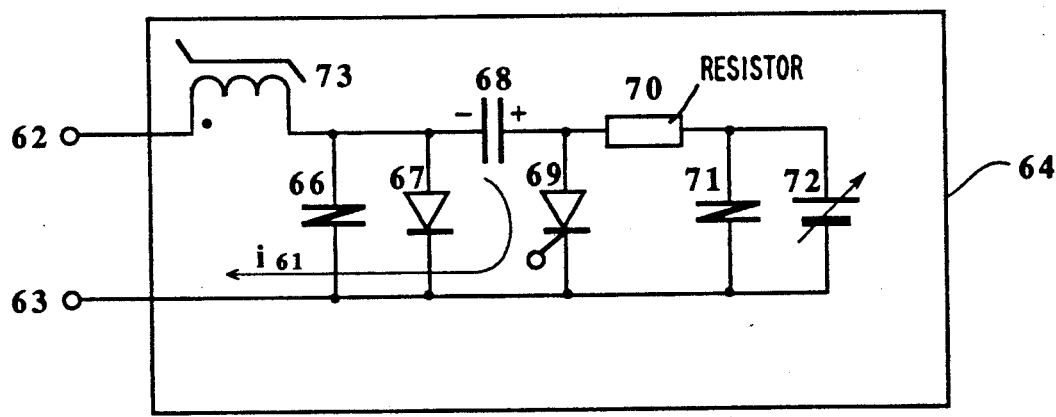
FIG. 13 is a schematic view showing the preset circuit 64 for use in the high-voltage pulse generating circuit according to another embodiment of the present invention.

FIG. 13 shows another preset circuit 64 for use in the high-voltage pulse generating circuit of FIG. 8, which comprises output terminals 62, 63, a presetting saturable reactor 73, varistors 66, 71 for absorbing surge voltage, a diode 67 a capacitor 68, a thyristor 69, a resistor 70 and a variable-voltage dc power supply 72.

By providing the presetting saturable reactor 73 to utilize its saturation region and its non-saturation region, low inductance necessary for reducing the pulse width of presetting pulse current and high inductance necessary for blocking the surge voltage induced in the preset winding 61 of the main saturable reactor 10 in the gate period can be achieved. Accordingly, the reduction of the preset period and the protection of the preset circuit 64 can be achieved, thereby facilitating a high-repetition operation.

The operation of the presetting saturable reactor 73 shown in FIG. 13 will be explained referring to FIGS. 8, 11, 13 and 14.

Figure 14:
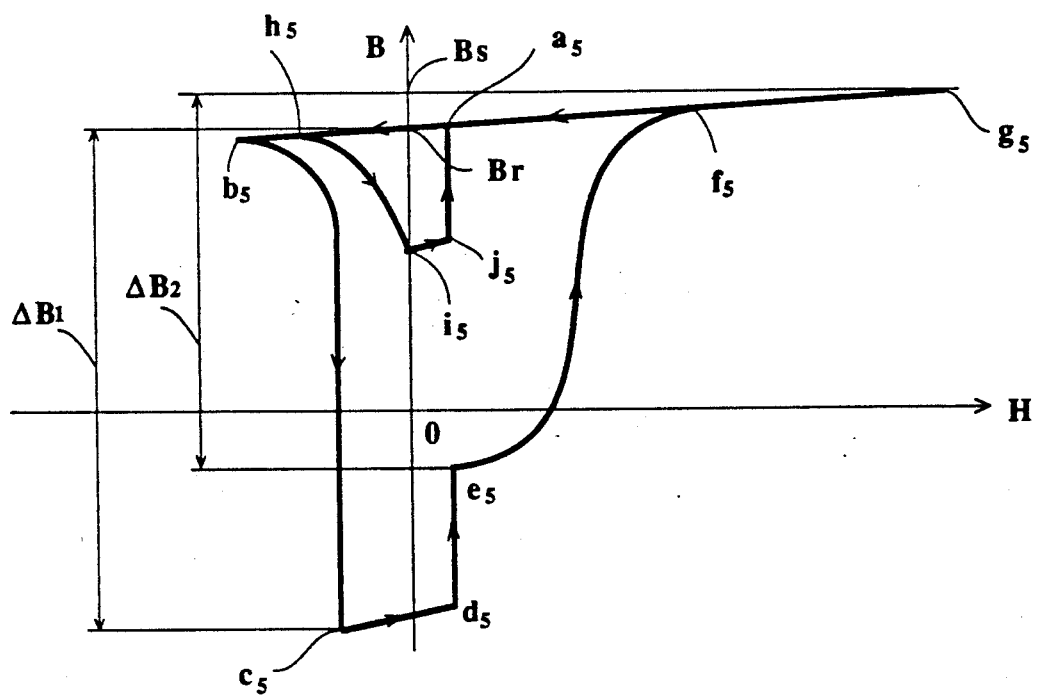
FIG. 14 is a graph schematically showing the operating magnetization curve of the saturable reactor 73 in the preset circuit 64 shown in FIG. 13.

During a period $T_1$ shown in FIG. 11, the magnetic flux density of the presetting saturable reactor 73 changes by $\Delta B_1$ from a point "$a_5$" to a point "$c_5$" in FIG. 14 in an opposite polarity to the dot shown in FIG. 13 due to surge voltage induced in the preset winding 61 of the main saturable reactor 10 in the polarity shown by the dot in FIG. 13. During this period, since the presetting saturable reactor 73 has an extremely large inductance, the surge voltage is blocked, thereby protecting the preset circuit 64. The magnetic flux density then changes from a point "$c_5$" to a point "$d_5$" by a self-setting action.

During a preset period $T_2$ shown in FIG. 11, the magnetic flux density of the presetting saturable reactor 73 changes from a point "$d_5$" to a point "$e_5$" in FIG. 14 due to the voltage induced in the preset winding 61 of the main saturable reactor 10 in an opposite polarity to the dot shown in FIG. 8.

During a preset period $T_3$ shown in FIG. 11, the thyristor 69 is turned on, so that the magnetic flux density of the presetting saturable reactor 73 changes from a point "$e_5$" to a point "$f_5$" in FIG. 14, and after saturation, it further changes to a point "$i_5$" via points "$g_5$" and "$h_5$." During the period from a point "$e_5$" to a point "$f_5$," since the presetting saturable reactor 73 shows an extremely large inductance, the discharge current $i_{61}$ from the capacitor 68 is extremely small. However, during the period from a point "$f_5$" to Br via a point "$g_5$," since the presetting saturable reactor 73 shows extremely small inductance, the discharge current $i_{61}$ is extremely large. Accordingly, the main saturable reactor 10 can be preset in a short period.

During a period $T_4$ shown in FIG. 11, the magnetic flux density of the presetting saturable reactor 73 changes from a point "$i_5$" to a point "$a_5$" via a point "$j_5$" in FIG. 14 due to voltage induced in the preset winding 61 of the main saturable reactor 10 in the opposite polarity to the dot shown in FIG. 13.

The above operation is repeated.

Figure 15:
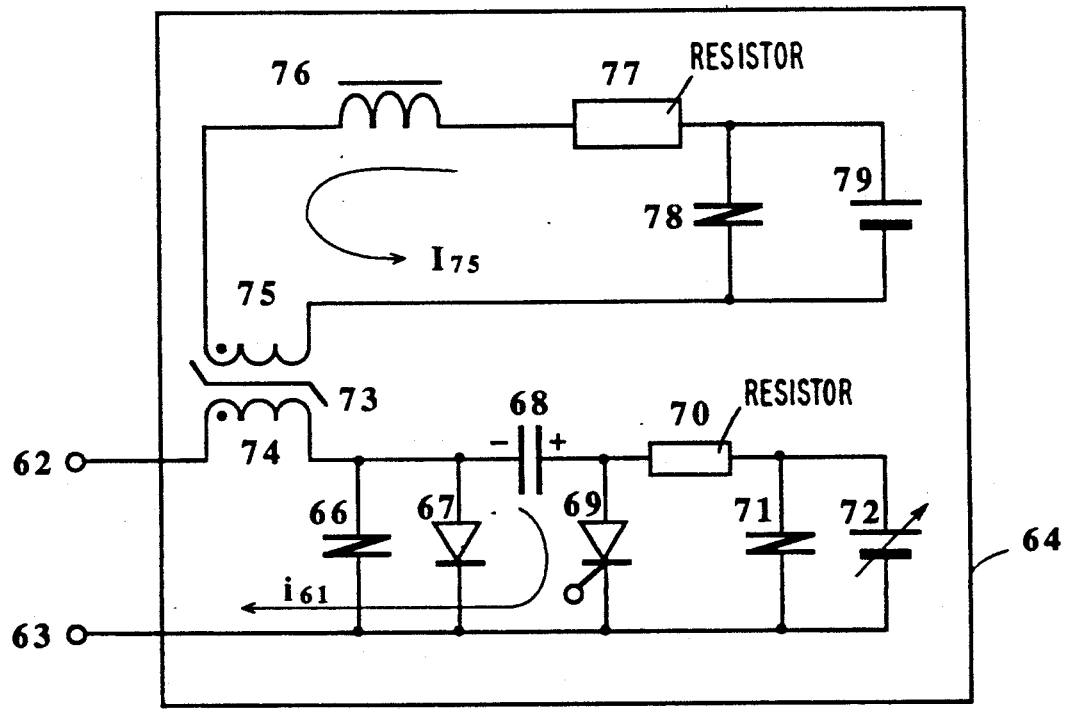
FIG. 15 is a schematic view showing the preset circuit 64 for use in the high-voltage pulse generating circuit according to a further embodiment of the present invention.

When a preset circuit shown in FIG. 15 is used instead of the preset circuit shown in FIG. 13, it is possible to keep the point "$a_5$" in FIG. 14 at a constant value by magnetizing the presetting saturable reactor 73 in the polarity shown by the dot in FIG. 13. Thus, the variation of the operating magnetic flux density $\Delta B_1$ and $\Delta B_2$ can be prevented, thereby extremely reducing the output jitter.

The preset circuit 64 shown in FIG. 15 comprises output terminals 62, 63, varistors 66, 71, 78 for absorbing surge voltage, a diode 67, a capacitor 68, a thyristor 69, resistors 70, 77, a variable-voltage dc power supply 72, an output winding 74 of the presetting saturable reactor 73, a reset winding 75 of the presetting saturable reactor 73, an inductor 76, and a dc power supply 79.

Figure 16:
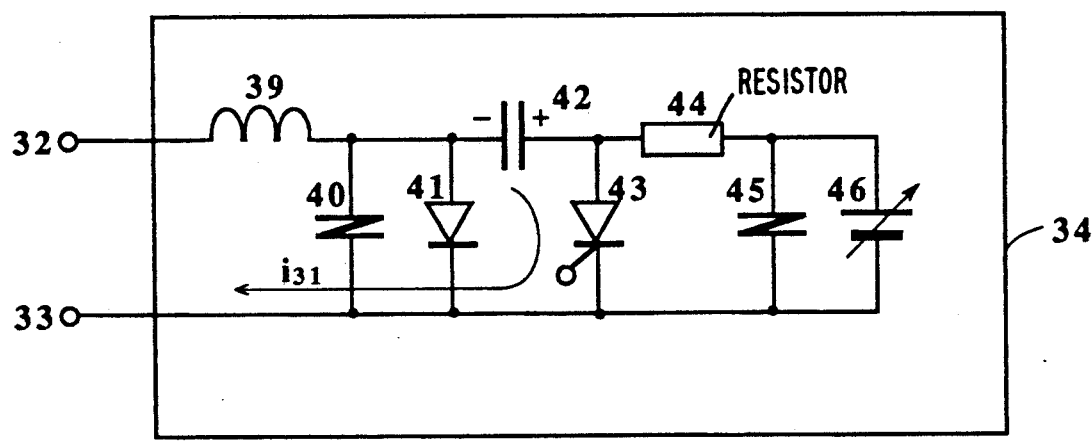
FIG. 16 is a schematic view showing the set circuit 34 for use in the high-voltage pulse generating circuit according to a further embodiment of the present invention.

In a still further embodiment of the present invention, the high-voltage pulse generating circuit of FIG. 8 containing a preset circuit shown in FIG. 10 and a set circuit shown in FIG. 16 is used for a discharge-excited laser.

In FIG. 16, the set circuit 34 comprises output terminals 32, 33, an inductor 39, varistors 40, 45 for absorbing surge voltage, a diode 41, a capacitor 42, a thyristor 43, a resistor 44 and a variable-voltage dc power supply 46.

The operation of the high-voltage pulse generating circuit shown in FIG. 8 containing a preset circuit shown in FIG. 10 and a set circuit shown in FIG. 16 will be explained referring to FIGS. 8, 10, and 16–17.

Figure 17:
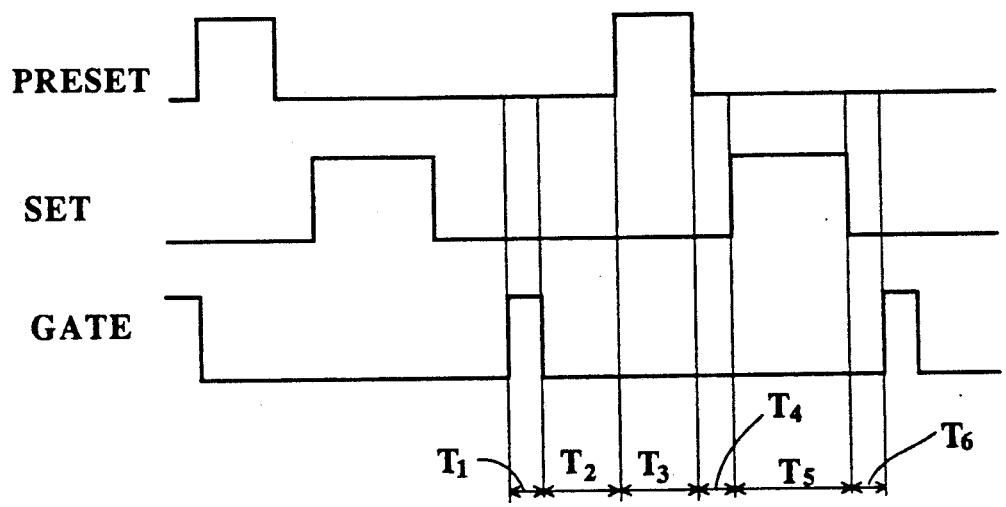
FIG. 17 is another timing chart of the high-voltage pulse generating circuit shown in FIG. 8.

During a period $T_1$ shown in FIG. 17, namely during a gate period, the thyratron 3 is turned on, so that charges stored in the main capacitor 5 in the polarity shown in the figure are transferred to the capacitor 6 along the course of discharge current $i_1$ shown in the figure. During this period, the magnetic flux density of the main saturable reactor 10 changes from a point "$a_6$" to a point "$b_6$" in FIG. 18, but the discharge current $i_2$ from the capacitor 6 to the peaking capacitor 8 is extremely small because the output winding 11 of the main saturable reactor 10 has an extremely large inductance. Accordingly, most of the terminal voltage $v_6$ of the capacitor 6 is applied to the output winding 11 of the main saturable reactor 10 in the polarity shown by the dot in FIG. 8. On the other hand, during this period, since the thyristors 43, 69 are in a turn-off state, surge voltage induced in the preset winding 61 and the set winding 31 of the main saturable reactor 10 is blocked by the inductors 65, 39, thereby protecting semiconductor elements, dc power supplies, etc.

Figure 18:
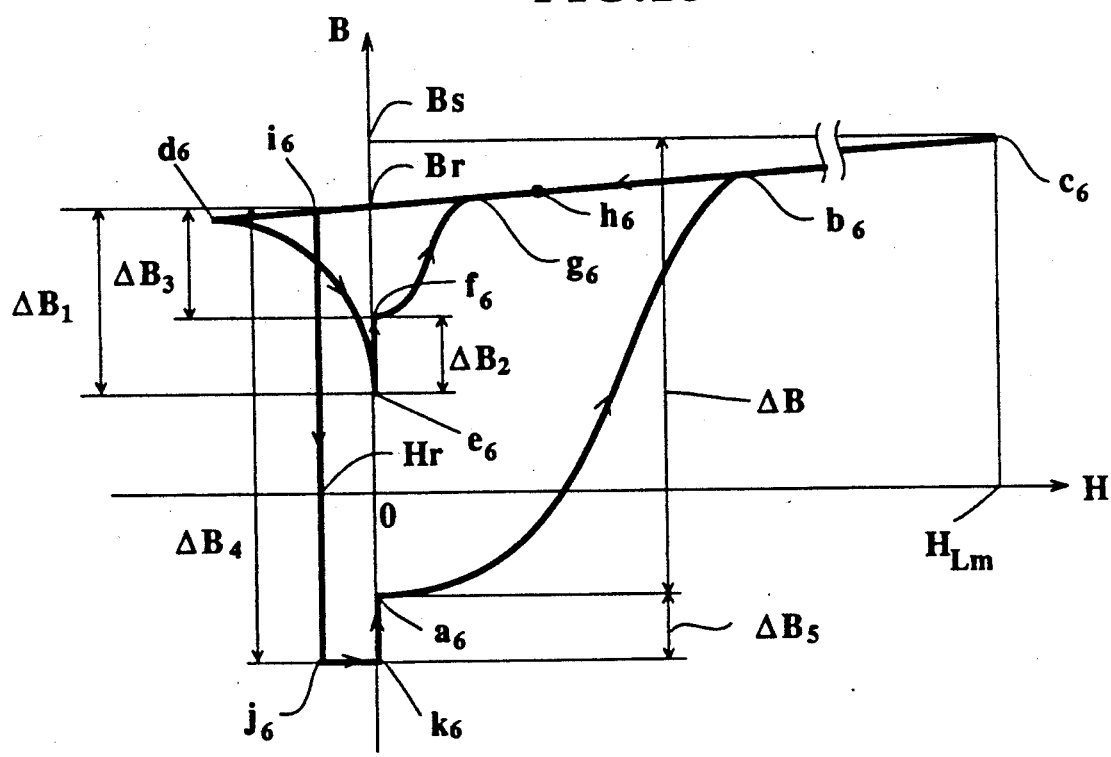
FIG. 18 is a graph schematically showing another operating magnetization curve of the main saturable reactor 10 in the high-voltage pulse generating circuit shown in FIG. 8.

As soon as the energy of the main capacitor 5 is mostly transferred to the capacitor 6, the magnetic flux density of the main saturable reactor 10 is saturated at a point "$b_6$" in FIG. 18. As a result, the inductance of the output winding 11 of the main saturable reactor 10 drastically decreases, and the current $i_2$ extremely increases, so that the energy of the capacitor 6 is transferred to the peaking capacitor 8. When the terminal voltage $v_8$ of the peaking capacitor 8 reaches a breakdown voltage of the main laser discharge electrodes 9, most of the energy stored in the peaking capacitor 8 is consumed in a laser gas via the main laser discharge electrodes 9, contributing to laser oscillation. However, part of the energy contributes to the resetting of the main saturable reactor 10 as current $i_2$ in the opposite direction. The magnetic flux density of the main saturable reactor 10 changes from a point "$b_6$" to a point "$e_6$" via points "$c_6$" and "$d_6$" in FIG. 18. Incidentally, in FIG. 18, $\Delta B$ means an operating magnetic flux density in a gate period, and $\Delta B_1$ means an operating magnetic flux density due to inverse current $i_2$.

During a period $T_2$ shown in FIG. 17, both the thyratron 3 and the thyristors 43, 69 are in a turn-off state. During this period, the magnetic flux density of the main saturable reactor 10 changes by $\Delta B_2$ from a point "$e_6$" to a point "$f_6$" in FIG. 18 due to a self-setting action.

During a period $T_3$ shown in FIG. 17, the thyristor 69 is turned on, so that charges stored in the capacitor 68 in the polarity shown in the figure are discharged along the course of discharge current $i_{61}$ shown in the figure, and supplied to the preset winding 61 of the main saturable reactor 10, thereby magnetizing it in the polarity shown by the dot in FIG. 8. By this presetting action, the magnetic flux density of the main saturable reactor 10 changes from a point "$f_6$" to Br via points "$g_6$" and "$h_6$" by $\Delta B_3$ in FIG. 18.

During a period $T_4$ shown in FIG. 17, the thyristor 69 is in a turn-off state. During this period, the magnetic flux density of the main saturable reactor 10 is equal to Br.

During a period $T_5$ shown in FIG. 17, the thyristor 43 is turned on, so that charges stored in the capacitor 42 in the polarity shown in the figure are discharged along the course of discharge current $i_{31}$ shown in the figure, and supplied to the set winding 31 of the main saturable reactor 10, thereby magnetizing it in the polarity shown by the dot in FIG. 8. As a result, the magnetic flux density of the main saturable reactor 10 changes from Br to a point "$k_6$," via points "$i_6$" and "$j_6$" by $\Delta B_4$ in FIG. 18.

During a period $T_6$ shown in FIG. 17, the thyristor 43 is in a turn-off state. During this period, the magnetic flux density of the main saturable reactor 10 changes from a point "$k_6$" to a point "$a_6$" by $\Delta B_5$ by self-setting.

The above operation is repeated.

In this embodiment, the output jitter can be suppressed, and optimum operation can be easily conducted for varied input voltage.

Figure 19:
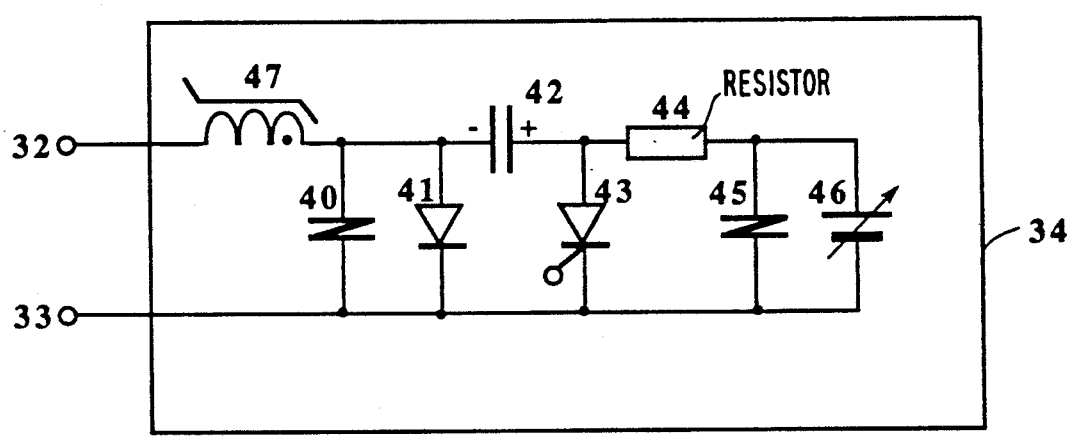
FIG. 19 is a schematic view showing the set circuit 34 for use in the high-voltage pulse generating circuit according to a still further embodiment of the present invention.

When the set circuit 34 shown in FIG. 19 is used, the same effects as those of the reset circuit shown in FIG.

2 can be obtained, whereby high-repetition operation can be easily achieved. The set circuit 34 of FIG. 19 comprises output terminals 32, 33, varistors 40, 45 for absorbing surge voltage, a diode 41, a capacitor 42, a resistor 44, a variable-voltage dc power supply 46 and a setting saturable reactor 47.

Figure 20:
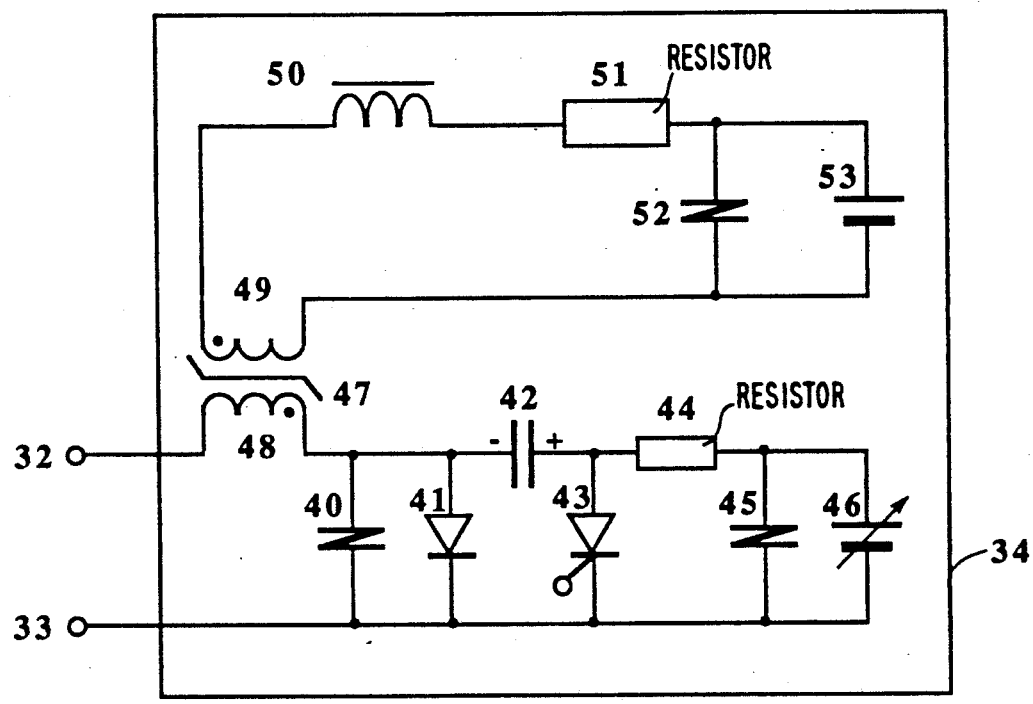
FIG. 20 is a schematic view showing the set circuit 34 for use in the high-voltage pulse generating circuit according to a still further embodiment of the present invention.

When the set circuit 34 shown in FIG. 20 is used, the same effects as those of the reset circuit 15 shown in FIG. 6 can be obtained, whereby the setting saturable reactor 47 can be miniaturized. The set circuit 34 of FIG. 20 comprises output terminals 32, 33, varistors 40, 45, 52 for absorbing surge voltage, a diode 41, a capacitor 42, a thyristor 43, resistors 44, 51, a variable-voltage dc power supply 46, a setting saturable reactor 47, an output winding 48 for the setting saturable reactor 47, a set winding 49 for the setting saturable reactor 47, an inductor 50 and a dc power supply 53.

Figure 21:
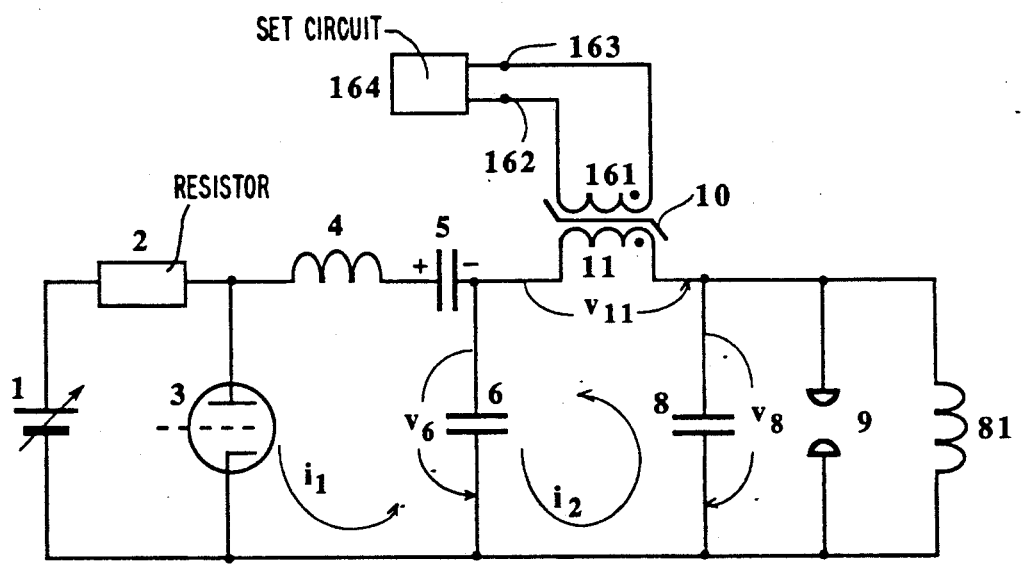
FIG. 21 is a schematic view showing the high-voltage pulse generating circuit according to a still further embodiment of the present invention.

FIG. 21 shows a high-voltage pulse generating circuit used for a discharge-excited laser according to a further embodiment of the present invention. This high-voltage pulse generating circuit comprises a variable high-voltage dc power supply 1, a resistor 2 for charging a main capacitor 5, a thyratron 3, an inductor 4, a capacitor 6, a peaking capacitor 8, main laser discharge electrodes 9, a saturable reactor 10, an output winding 11 of the saturable reactor 10, a set winding 161 for the saturable reactor 10, a set circuit 164 having output terminals 162, 163 connected to terminals of the set winding 161 of the main saturable reactor 10, and an inductor 81 for charging the main capacitor 5.

In this embodiment shown in FIG. 21, since the inductor 81 for charging the main capacitor 5 is disposed on the output side of the output winding 11 of the main saturable reactor 10, the main capacitor-charging current functions as presetting current for the main saturable reactor 10.

Figure 32:
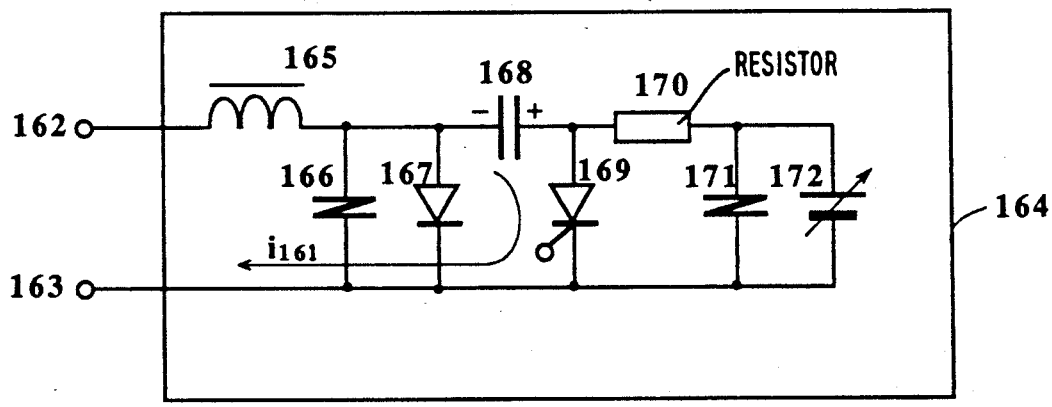
FIGS. 32-34 are schematic views showing various examples of set circuits for use in the high-voltage pulse generating circuit shown in FIG. 21.

FIG. 32 shows a set circuit 164 used in the high-voltage pulse generating circuit of FIG. 21 according to a further embodiment of the present invention, which comprises output terminals 162, 163, an inductor 165 for absorbing surge voltage, varistors 166, 171 for absorbing surge voltage, a diode 167, a capacitor 168, a thyristor 169, a resistor 170, and a variable-voltage dc power supply 172.

The operation of the circuit shown in FIG. 21 containing the set circuit 164 of FIG. 32 will be explained referring to FIGS. 22-23.

Figure 22:
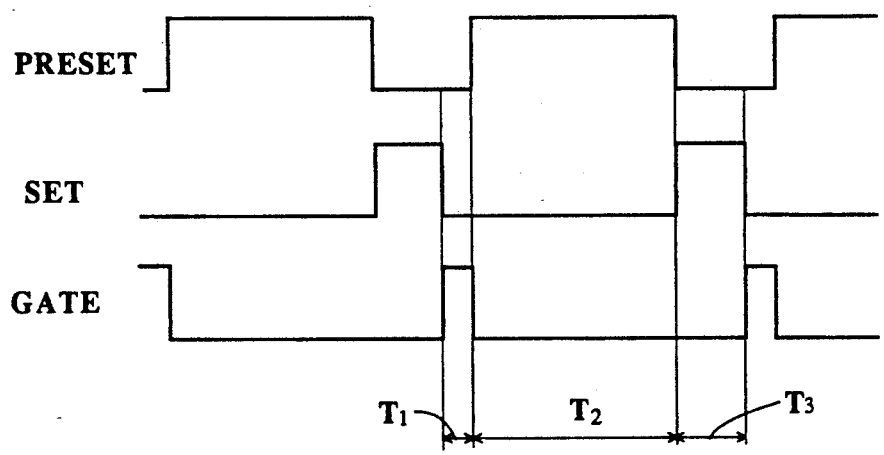
FIG. 22 is a timing chart of the high-voltage pulse generating circuit shown in FIG. 21.

During a period $T_1$ shown in FIG. 22, namely during a gate period, the thyratron 3 is turned on, so that charges stored in the main capacitor 5 in the polarity shown in the figure are transferred to the capacitor 6 along the course of discharge current $i_1$ shown in the figure. During this period, the magnetic flux density of the main saturable reactor 10 changes from a point "$a_7$" to a point "$b_7$" in FIG. 23, but the discharge current $i_2$ from the capacitor 6 to the peaking capacitor 8 is extremely small because the output winding 11 of the main saturable reactor 10 has an extremely large inductance. Accordingly, most of the terminal voltage $v_6$ of the capacitor 6 is applied to the output winding 11 of the main saturable reactor 10 in the polarity shown by the dot in FIG. 21.

On the other hand, during this period, since the thyristor 169 of the set circuit 164 shown in FIG. 32 is in a turn-off state, surge voltage induced in the set winding 161 of the main saturable reactor 10 in the polarities shown by the dots in FIG. 21 is blocked by the inductor 165, thereby protecting each element, etc. in the set circuit 164.

Figure 23:
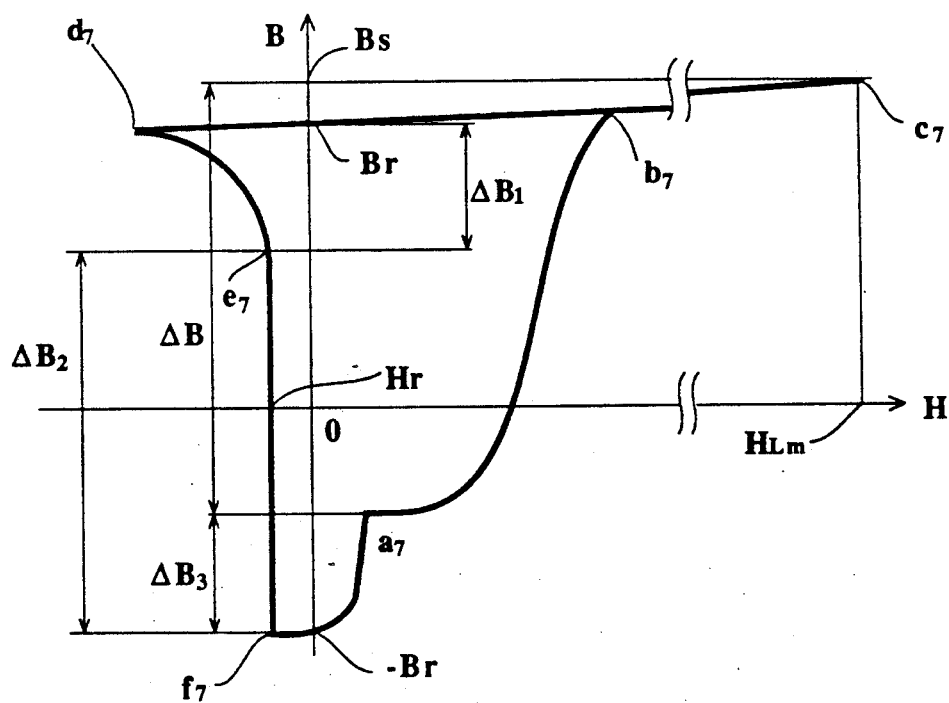
FIG. 23 is a graph schematically showing the operating magnetization curve of the main saturable reactor 10 in the high-voltage pulse generating circuit shown in FIG. 21.
Figure 24:
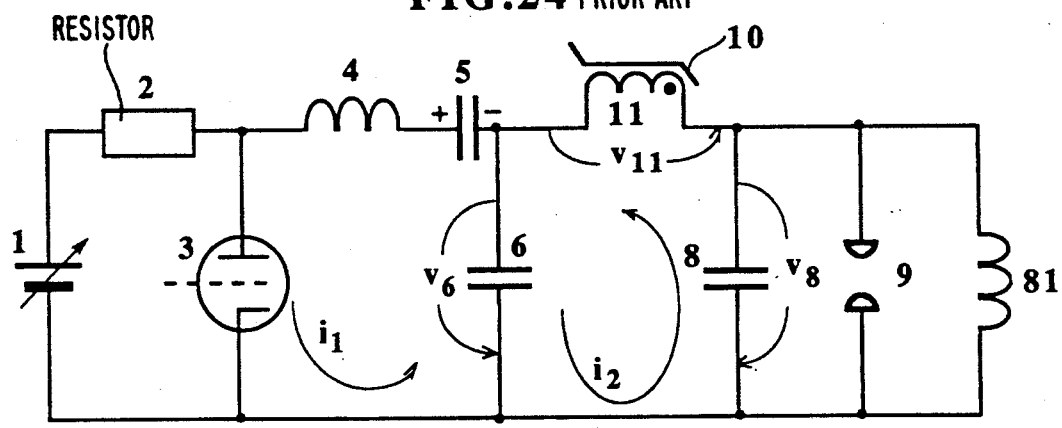
FIG. 24 is a schematic view showing one example of conventional high-voltage pulse generating circuits.
Figure 25:
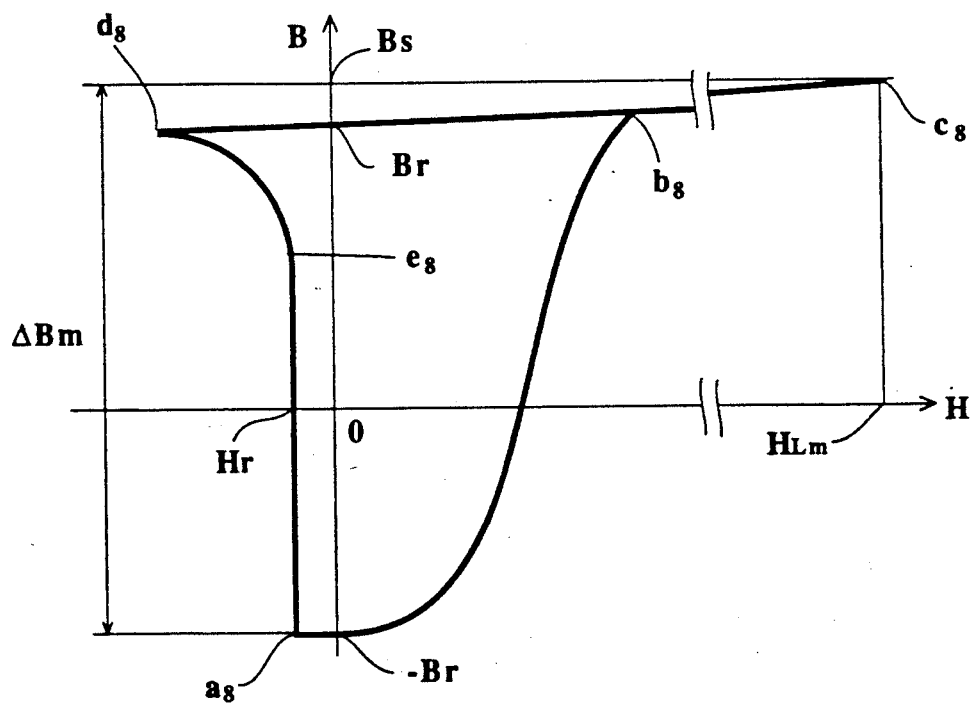
FIG. 25 is a graph schematically showing the operating magnetization curve of the main saturable reactor 10 in the conventional high-voltage pulse generating circuit.

As soon as the energy of the main capacitor 5 is mostly transferred to the capacitor 6, the magnetic flux density of the main saturable reactor 10 is saturated at a point "$b_7$" in FIG. 23. As a result, the inductance of the output winding 11 of the main saturable reactor 10 drastically decreases, and the current $i_2$ extremely increases, so that the energy of the capacitor 6 is transferred to the peaking capacitor 8. When the terminal voltage $v_8$ of the peaking capacitor 8 reaches a breakdown voltage of the main laser discharge electrodes 9, most of the energy stored in the peaking capacitor 8 is consumed in a laser gas via the main laser discharge electrodes 9, contributing to laser oscillation. However, part of the energy also contributes to the resetting of the main saturable reactor 10 as inverse current in the opposite polarity to $i_2$. The magnetic flux density of the main saturable reactor 10 changes from a point "$b_7$" to a point "$e_7$" via points "$c_7$" and "$d_7$" in FIG. 23. In FIG. 23, $\Delta B$ means an operating magnetic flux density in a gate period, and $\Delta B_1$ means an operating magnetic flux density due to inverse current $i_2$.

During a presetting period $T_2$ shown in FIG. 22, both the thyratron 3 and the thyristor 169 are in a turn-off state. During this period, the magnetic flux density of the main saturable reactor 10 changes by $\Delta B_2$ from a point "$e_7$" to $-Br$ via a point "$f_7$" in FIG. 23 due to the main capacitor-charging current which flows through the course from a plus terminal of the input power supply 1 to the resistor 2, the inductor 4, the main capacitor 5, the output winding 11 of the main saturable reactor 10, the inductor 81 and a minus terminal of the input power supply 1. Thus, the presetting of the main saturable reactor 10 is conducted.

During a period $T_3$ shown in FIG. 22, the thyristor 169 is turned on, so that charges stored in the capacitor 168 in the polarity shown in the figure are discharged along the course of discharge current $i_{161}$ shown in the figure, and supplied to the set winding 161 of the main saturable reactor 10, thereby magnetizing it in the polarity shown by the dot in FIG. 21. As a result, the magnetic flux density of the main saturable reactor 10 changes from $-Br$ to a point "$a_7$" by $\Delta B_3$ in FIG. 23.

The above operation is repeated.

Figure 33:
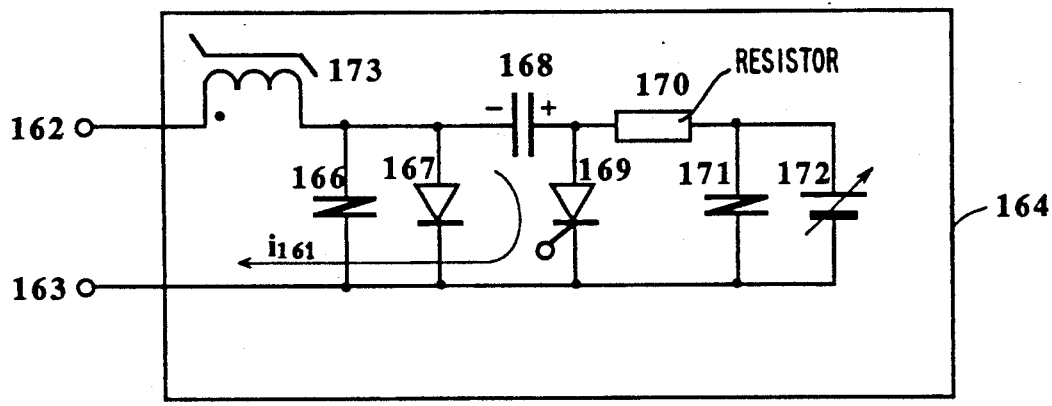
Figure 34:
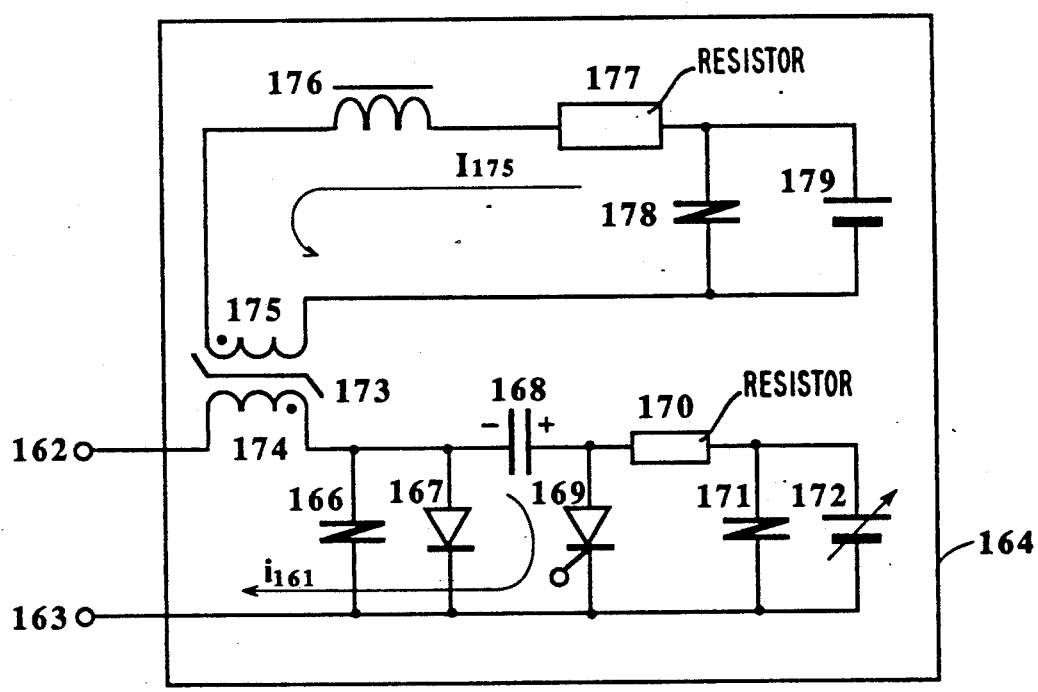

In the high-voltage pulse generating circuit shown in FIG. 21, a set circuit shown in FIG. 33 or 34 may be used. The set circuit of FIG. 33 comprises output terminals 162, 163, a second saturable reactor 173, varistors 166, 171 for absorbing surge voltage, a diode 167, a capacitor 168, a thyristor 169, a resistor 170 and a variable-voltage dc power supply 172. The set circuit of FIG. 34 comprises output terminals 162, 163, a second saturable reactor 173, varistors 166, 171, 178 for absorbing surge voltage, a diode 167, a capacitor 168, a thyristor 169, resistors 170, 177, a variable-voltage dc power supply 172, an output winding 174 of the second saturable reactor 173, a reset winding 175 of the second saturable 173, an inductor 176 for absorbing surge voltage, and a dc power supply 179.

When the set circuit of FIG. 33 or 34 is used, the limit of high-repetition operation is as high as 500 Hz or more, while it is about 300 Hz when the set circuit of FIG. 32 is used. Also, when the set circuit 164 of FIG. 33 is used, the laser output jitter is as high as two times that in the case of the reset circuit 15 of FIG. 2. On the other hand, when the set circuit 164 of FIG. 34 is used, the laser output jitter is substantially the same as in the case of the reset circuit 15 of FIG. 2.

Incidentally, the thyratrons 20, 69, 43, 169 in FIGS. 2, 6, 10, 13, 15, 16, 19, 20, 32-34 may be replaced by any other switching elements such as transistors. When the transistors are used, both width and intensity of pulse applied to the main saturable reactor can be controlled.

The present invention will be explained in further detail by means of the following Examples.

EXAMPLE 1

In this Example, the high-voltage pulse generating circuit of FIG. 1 containing the reset circuit of FIG. 2 was used.

Table 1 shows the materials of magnetic cores of the main saturable reactor 10 used in this Example and their dc magnetic properties, and Table 2 shows the shapes of the magnetic cores used. In this Example, a plurality of toroidal unit magnetic cores shown in Table 2 were combined as shown in Table 3, and one turn of a wire was wound concentrically. To prevent temperature rise due to core loss, the magnetic cores were cooled by a silicone oil.

In the reset circuit 15 shown in FIG. 2, the second saturable reactor 16 comprised two Ni-Zn ferrite toroidal magnetic cores having shapes and dc magnetic properties shown in Table 4, and 25 turns of windings. The capacitor 19 had a capacitance of 10 μF, and the voltage of the power supply 23 was set at a proper level for each sample.

With each sample shown in Tables 1-3 used as a magnetic core of the main saturable reactor 10, the high-voltage pulse generating circuit shown in FIG. 1 was operated under the following conditions:
  Voltage of input power supply 1: 25-35 kV (variable);
  Capacitance of capacitor 5,6,8: 20 nF;
  Effective length between main laser discharge electrodes 9: 300 mm;
  Laser gas: Mixed gas of He, Kr and $F_2$;
  Repetition rate: 300 Hz; and
  Preliminary ionization: UV automatic preliminary ionization (Uniform preliminary ionization was conducted in the main laser discharge electrodes 9 with a gap of about 1 mm disposed in the course of current $i_2$ in FIG. 1).

Table 5 shows energy transmission efficiency $\eta t$ from the main capacitor 5 to the peaking capacitor 8 (a ratio of input energy of the peaking capacitor 8 to that of the main capacitor 5), total laser efficiency $\eta$ (a ratio of laser output Po to an input energy of the main capacitor 5), laser output Po, service life of the laser gas and jitter of the laser output. Incidentally, the energy transmission efficiency $\eta t$, the total laser efficiency $\eta$ and the laser output Po are values obtained at half a laser gas service life. The laser gas service life is defined as a period until the laser output Po decreases by 5%. The jitter of the laser output means time fluctuation at 1000 shots at half a laser gas service life.

TABLE 1

| Sample No.[1] | Composition (atomic %) | $B_{800}$[2] (T) | $Br/B_{800}$ | Hc (A/m) | $\lambda S$[3] ($\times 10^{-6}$) |
|---|---|---|---|---|---|
| 1 | Amorphous $Co_{72.8}Fe_{1.5}Mn_{3.9}Si_{13}B_{8.5}Nb_{0.3}$ | 0.90 | 0.98 | 1.0 | about 0 |
| 2 | Amorphous $Co_{70}Fe_{0.4}Mn_{5.8}Si_{15}B_{8.5}Nb_{0.3}$ | 0.78 | 0.90 | 0.54 | about 0 |
| 3 | Amorphous $Co_{69}Fe_{4.1}Ni_{1.4}Mo_{1.5}Si_{12}B_{12}$ | 0.78 | 0.62 | 0.62 | about 0 |
| 4 | Amorphous $Co_{69}Fe_4Cr_2Si_{15}B_{10}$ | 0.65 | 0.86 | 0.53 | about 0 |
| 5 | Amorphous $Co_{69}Fe_{1.5}Mn_{3.5}Mo_{2.5}Si_{15}B_{8.5}$ | 0.60 | 0.85 | 0.45 | about 0 |
| 6 | Amorphous $Co_{66}Fe_4Mo_2Si_{16}B_{12}$ | 0.55 | 0.73 | 0.33 | about 0 |
| 7 | Amorphous $Fe_{66}Co_{18}Si_{1.0}B_{15}$ | 1.63 | 0.83 | 8.2 | 35 |
| 8 | Amorphous $Fe_{81}Si_{3.5}B_{13.5}C_2$ | 1.43 | 0.67 | 4.3 | 30 |
| 9 | Amorphous $Fe_{78}Si_9B_{13}$ | 1.37 | 0.47 | 3.2 | 27 |
| 10 | Amorphous $Fe_{78}Cu_{0.5}Si_{13}B_{8.5}$ | 1.37 | 0.59 | 4.1 | 21 |
| 11 | Amorphous $Co_{70}Ni_{8.0}Si_{13.5}B_{8.5}$ | 1.32 | 0.73 | 3.8 | 29 |
| 12 | Fine Crystalline $Fe_{77}Cu_1Si_{10}B_9Nb_3$ | 1.43 | 0.83 | 1.4 | 1.6 |
| 13 | Fine Crystalline $Fe_{74}Cu_{1.5}Si_{14}B_{8.5}Nb_2$ | 1.23 | 0.91 | 1.1 | 1.8 |
| 14 | Fine Crystalline $Fe_{75}Cu_1Si_{13}B_9Ta_2$ | 1.21 | 0.80 | 1.6 | 1.6 |
| 15 | Fine Crystalline $Fe_{72}Cu_1Si_{14}B_8Ti_5$ | 1.10 | 0.69 | 1.3 | 1.8 |
| 16 | Fine Crystalline $Fe_{71}Cu_1Si_{13}B_{10}W_5$ | 0.98 | 0.74 | 1.1 | 2.5 |
| 17 | Fine Crystalline $Fe_{74}Cu_1Si_{17}B_5Ta_3$ | 0.97 | 0.92 | 0.92 | −0.3 |

Note
[1]Sample Nos. 1-11 had interlaminar insulation with a 7.5-μm-thick polyimide film. Sample Nos. 12-17 had interlaminar insulation with MgO.
[2]$B_{800}$ is a magnetic flux density at a magnetization of 800 A/m.
[3]$\lambda S$ is saturation magnetostriction.

TABLE 2

| Size Outer Diameter × Inner Diameter × Height | Effective Cross Section Ae (mm²) | Mean Magnetic Path Length le (mm) |
|---|---|---|
| 155 mmφ × 58.5 mmφ × 25 mmt | 750 | 338 |

TABLE 3

| Sample No. | Number of Unit Magnetic Core |
|---|---|
| 1 | 4 |
| 2 | 5 |
| 3 | 5 |
| 4 | 5 |
| 5 | 6 |
| 6 | 6 |
| 7 | 2 |
| 8 | 3 |
| 9 | 3 |
| 10 | 3 |
| 11 | 3 |
| 12 | 3 |
| 13 | 3 |
| 14 | 3 |
| 15 | 4 |
| 16 | 4 |
| 17 | 4 |

TABLE 4

| | Sample No. 21 |
|---|---|
| Material: | Ni—Zn Ferrite |

TABLE 4-continued

Sample No. 21

| Size | |
|---|---|
| Outer Diameter: | 100 mmφ |
| Inner Diameter: | 50 mmφ |
| Height: | 25 mmt |
| Effective Cross Section (mm$^2$): | 625 |
| Mean Magnetic Path Length (mm): | 236 |
| $B_{800}$* (T): | 0.28 |
| Br (T): | 0.089 |
| Hc (A/m): | 9.6 |

Note
*$B_{800}$ is a magnetic flux density at a magnetization of 800 A/m.

TABLE 5

| Sample No. | Energy Transmission Efficiency ηt (%) | Total Laser Efficiency η (%) | Laser Output Po (W) | Gas Service Life × 10$^6$ Shots | Laser Output Jitter (ns) |
|---|---|---|---|---|---|
| 1 | 69 | 0.92 | 25 | 4.5 | ±9 |
| 2 | 76 | 1.2 | 32 | 4.8 | ±9 |
| 3 | 73 | 0.96 | 26 | 4.7 | ±12 |
| 4 | 78 | 1.2 | 32 | 4.8 | ±8 |
| 5 | 80 | 1.4 | 37 | 5.2 | ±9 |
| 6 | 79 | 1.3 | 35 | 5.2 | ±10 |
| 7 | 41 | 0.42 | 11 | 3.3 | ±25 |
| 8 | 57 | 0.71 | 19 | 3.9 | ±29 |
| 9 | 42 | 0.44 | 12 | 3.3 | ±36 |
| 10 | 42 | 0.44 | 12 | 3.3 | ±33 |
| 11 | 62 | 0.79 | 21 | 4.2 | ±24 |
| 12 | 69 | 1.0 | 27 | 4.6 | ±10 |
| 13 | 77 | 1.2 | 32 | 4.9 | ±8 |
| 14 | 76 | 1.1 | 30 | 4.7 | ±9 |
| 15 | 78 | 1.2 | 32 | 5.0 | ±11 |
| 16 | 74 | 1.1 | 30 | 4.8 | ±9 |
| 17 | 79 | 1.3 | 35 | 5.2 | ±8 |

As is shown in Table 5, when Co-base amorphous magnetic cores in Sample Nos. 1–6, and Fe-base fine crystalline magnetic cores in Sample Nos. 12–17 were used for the main saturable reactor 10, better results were obtained with respect to energy transmission efficiency ηt, total laser efficiency η, laser output Po, and gas service life, and the jitter of the laser output was reduced by almost ½ than when the Fe-base amorphous magnetic cores were used. Further, when the magnetic cores having a squareness ratio Br/$B_{800}$ of 0.7 or more in dc magnetic properties were used, the jitter of the laser output was small among the magnetic cores of the same category.

Figure 26:
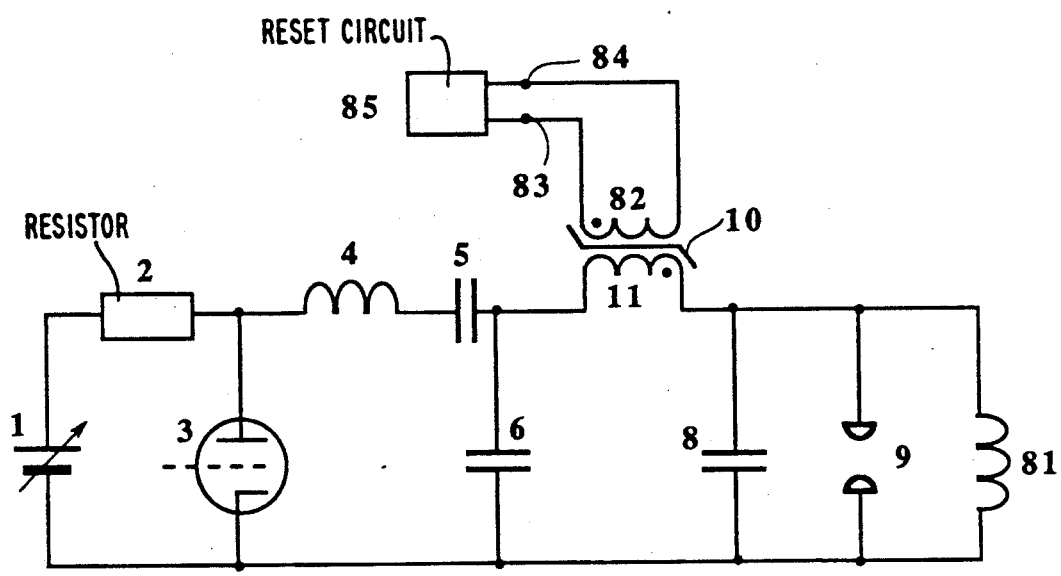
FIG. 26 is a schematic view showing another example of conventional high-voltage pulse generating circuit.
Figure 27:
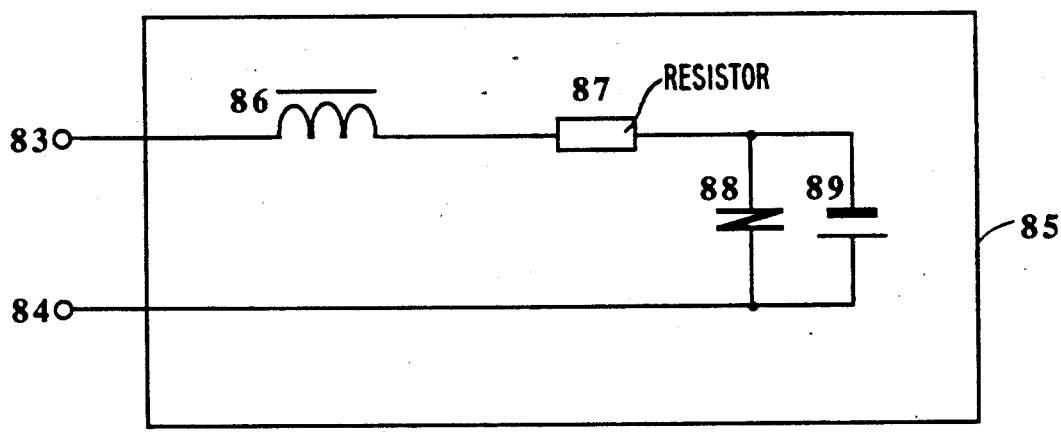
FIG. 27 is a schematic view showing a conventional reset circuit.
Figure 28:
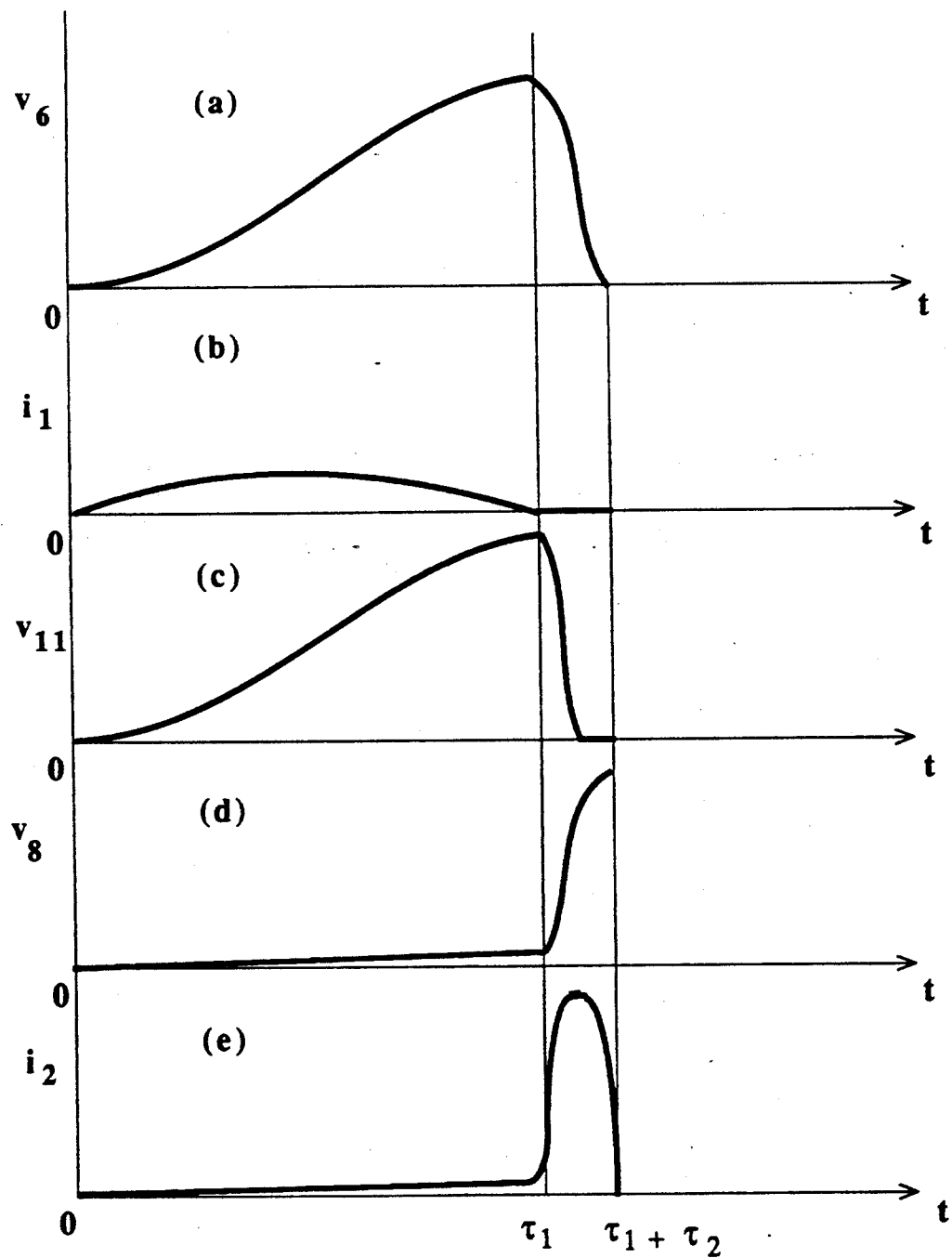
FIGS. 28 (a)–(e) are graphs showing waveforms of current and voltage in various elements in the high-voltage pulse generating circuit of the present invention when input voltage is optimized.
Figure 29:
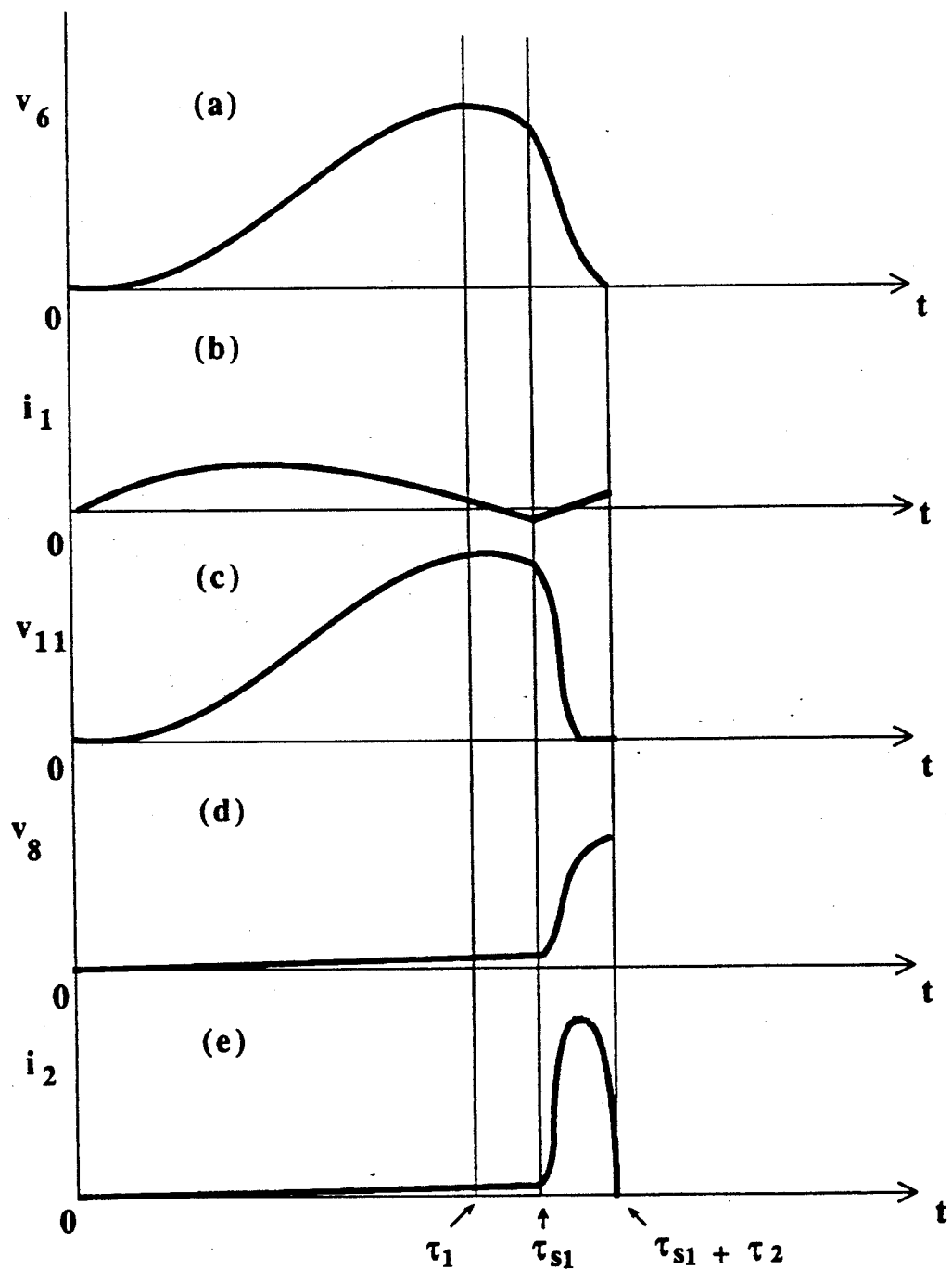
FIGS. 29 (a)–(e) are graphs showing waveforms of current and voltage in various elements in the conventional high-voltage pulse generating circuit when input dc power supply voltage is lower than an optimum value.
Figure 30:
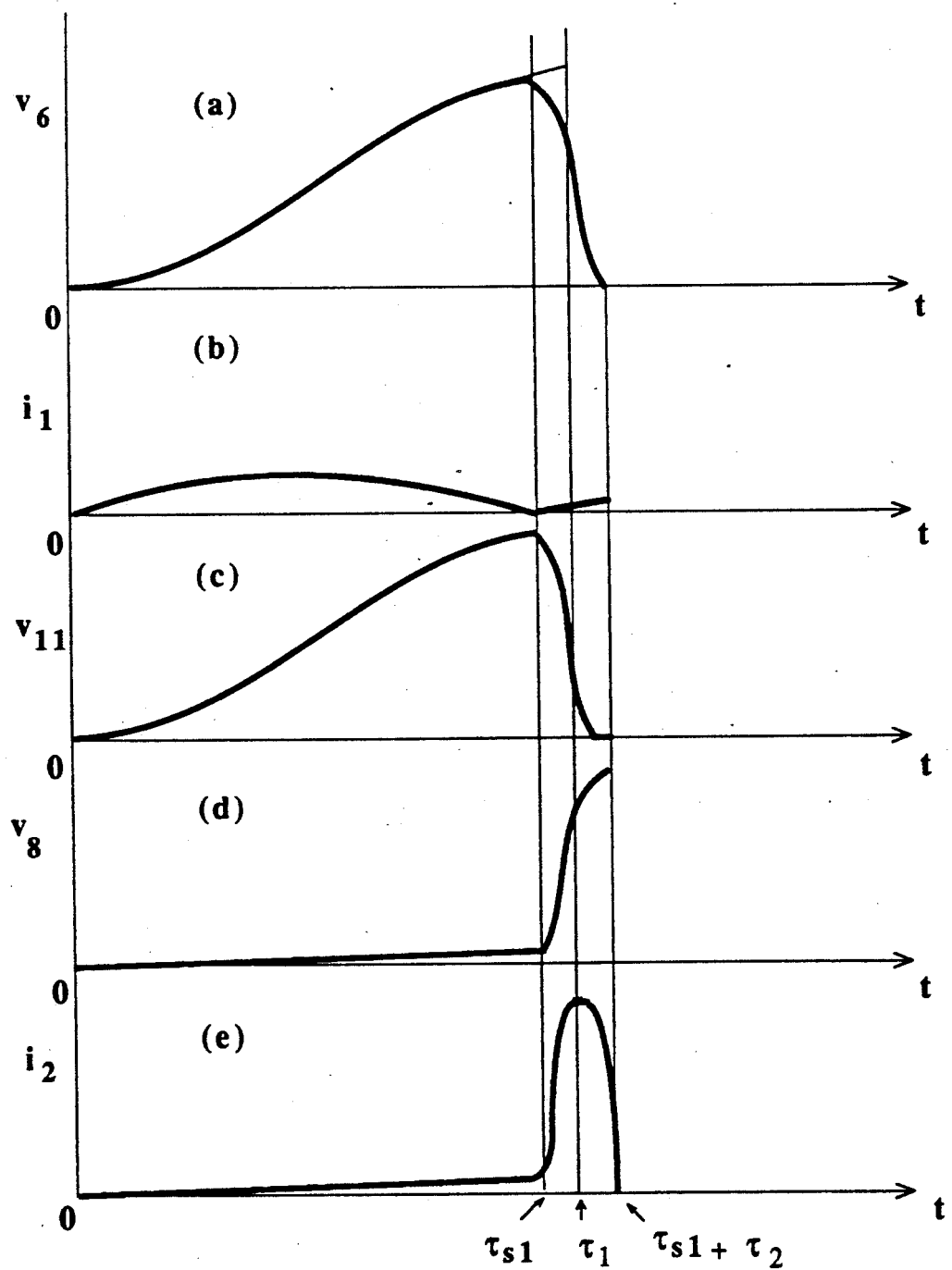
FIGS. 30 (a)–(e) are graphs showing waveforms of current and voltage in various elements in the conventional high-voltage pulse generating circuit when input dc power supply voltage is higher than an optimum value.
Figure 31:
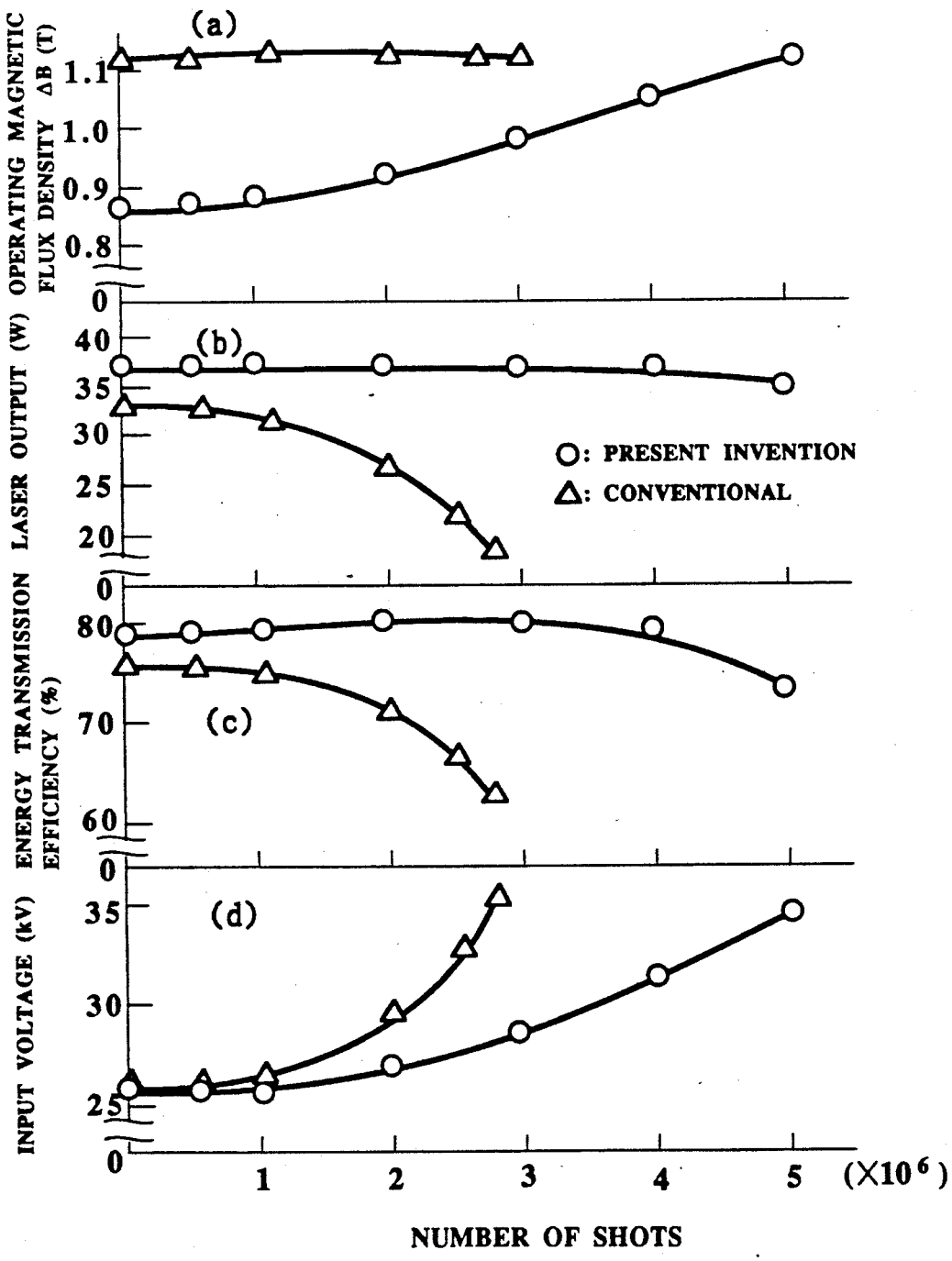
FIG. 31 (a) is a graph showing the relation between operating magnetic flux density and number of shots; (b) is a graph showing the relation between laser output and number of shots; (c) is a graph showing the relation between energy transmission efficiency and number of shots; (d) is a graph showing the relation between input voltage and number of shots.

FIGS. 31(a)–31(d) shows the relations of the various properties and the number of shots. In these figures, circles represent the saturable reactor made of Sample No. 5 used in the high-voltage pulse generating circuit of the present invention, and triangles represent the same saturable reactor in the conventional circuit shown in FIG. 26. In the present invention, it is easy to keep the laser output Po at a constant level while compensating the deterioration of the laser gas. Also, it is expected from the reduction of the energy transmission efficiency ηt that the inverse current of the thyratron can be suppressed, thereby improving the thyratron service life by about one order.

EXAMPLE 2

In this Example, the high-voltage pulse generating circuit of FIG. 1 containing the reset circuit of FIG. 6 was used.

Table 6 shows shapes and dc magnetic properties of the magnetic cores used in the second saturable reactor 16.

In the case of No. 22, stable operation of the reset circuit 15 could be conducted even at a high repetition of 500 Hz under the conditions:

| Number of cores: | 1; |
|---|---|
| Output winding 24: | 10 turns; |
| Reset winding 25: | 1 turn; and |
| $I_{25}$: | 1.0 A. |

In the case of No. 23, stable operation of the reset circuit 15 could be conducted even at a high repetition rate of 500 Hz under the conditions:

| Number of cores: | 1; |
|---|---|
| Output winding 24: | 20 turns; and |
| Reset winding 25: | 6 turns; and |
| $I_{25}$: | 2.0 A. |

Table 7 shows jitters of laser outputs.

TABLE 6

| | Sample No. | |
|---|---|---|
| | 22 | 23 |
| Material: | Amorphous $Co_{69}Fe_{1.5}Mn_{3.5}Mo_{2.5}Si_{15}B_{8.5}$ | Ni—Zn Ferrite |
| Size | | |
| Outer Diameter: | 100 mmφ | 100 mmφ |
| Inner Diameter: | 58.5 mmφ | 50 mmφ |
| Height: | 25 mmt | 12.7 mmt |
| Effective Cross Section (mm$^2$): | 330 | 318 |
| Mean Magnetic Path Length (mm): | 251 | 236 |
| $B_{800}$* (T): | 0.60 | 0.36 |
| Br (T): | 0.57 | 0.26 |
| Hc (A/m): | 0.41 | 18 |

Note
*$B_{800}$ is a magnetic flux density at a magnetization of 800 A/m.

TABLE 7

| | Jitter (ns) Measured with | | |
|---|---|---|---|
| | Second Saturable Reactor 16 not Reset | Second Saturable Reactor 16 Reset | |
| Sample No. | No. 21 | No. 22 | No. 23 |
| 1 | ±9 | ±5 | ±5 |
| 2 | ±9 | ±6 | ±5 |
| 3 | ±12 | ±8 | ±9 |
| 4 | ±8 | ±5 | ±4 |
| 5 | ±9 | ±5 | ±5 |
| 6 | ±10 | ±5 | ±6 |
| 7 | ±25 | ±18 | ±19 |
| 8 | ±29 | ±22 | ±22 |
| 9 | ±36 | ±25 | ±26 |
| 10 | ±33 | ±25 | ±24 |
| 11 | ±24 | ±20 | ±20 |
| 12 | ±10 | ±7 | ±7 |
| 13 | ±8 | ±5 | ±6 |
| 14 | ±9 | ±5 | ±6 |
| 15 | ±11 | ±7 | ±8 |
| 16 | ±9 | ±5 | ±5 |
| 17 | ±8 | ±5 | ±5 |

Incidentally, Sample Nos. 1–17 appearing in Table 7 are the same as in Table 1, which show the materials of the main saturable reactor 10.

It is clear from Table 7 that the jitter can be reduced by resetting the second saturable reactor 16.

EXAMPLE 3

In this Example, the high-voltage pulse generating circuit of FIG. 8 containing the set circuit of FIG. 9 and the preset circuit of FIG. 10 was used. It was operated to measure laser output jitter under the same conditions as in Example 1 according to the timing chart shown in FIG. 11. Table 8 shows the comparison in jitter of the laser output between Examples 3 and 1.

TABLE 8

| | Jitter (ns) Sample | |
|---|---|---|
| No. | Example 1 | Example 3 |
| 1 | ±9 | ±3 |
| 2 | ±9 | ±3 |
| 3 | ±12 | ±5 |
| 4 | ±8 | ±3 |
| 5 | ±9 | ±3 |
| 6 | ±10 | ±4 |
| 7 | ±25 | ±12 |
| 8 | ±29 | ±13 |
| 9 | ±36 | ±15 |
| 10 | ±33 | ±15 |
| 11 | ±24 | ±12 |
| 12 | ±10 | ±4 |
| 13 | ±8 | ±3 |
| 14 | ±9 | ±3 |
| 15 | ±11 | ±4 |
| 16 | ±9 | ±3 |
| 17 | ±8 | ±3 |

It is clear from Table 8 that the high-voltage pulse generating circuit of this Example can reduce laser output jitter by more than one-half as compared with that in Example 1.

Table 9 shows maximum magnetic flux density in the preset period, specific permeability at the maximum magnetic flux density in the preset period, and output jitter on Sample Nos. 5, 11, 13 shown in Tables 1–3 used in the main saturable reactor 10 in the high-voltage pulse generating circuit of this Example. It is clear from Table 9 that the maximum magnetic flux density in the preset period is larger than the residual magnetic flux density of each sample in dc magnetic properties, and that the laser output jitter is reduced. Particularly, it is noted that in a case where the specific permeability is less than 10 at the maximum magnetic flux density in the preset period, the laser output jitter is greatly reduced.

TABLE 9

| Sample No. | Maximum Magnetic Flux Density at Presetting (T) | Specific Permeability at Maximum Magnetic Flux Density at Presetting | Laser Output Jitter (ns) |
|---|---|---|---|
| 5 | 0.46 | 250 | ±13 |
| 5 | 0.52 | 21 | ±9 |
| 5 | 0.57 | 6 | ±3 |
| 5 | 0.58 | 3 | ±3 |
| 11 | 0.91 | 130 | ±24 |
| 11 | 0.97 | 58 | ±21 |
| 11 | 1.21 | 21 | ±19 |
| 11 | 1.37 | 9 | ±12 |
| 13 | 0.97 | 210 | ±11 |
| 13 | 1.15 | 27 | ±8 |
| 13 | 1.18 | 9 | ±3 |
| 13 | 1.21 | 4 | ±3 |

Note
*Residual magnetic flux densities in dc magnetic properties of Sample Numbers 5, 11, 13 are 0.51 T, 0.96 T, and 1.12 T, respectively.

EXAMPLE 4

In this Example, the high-voltage pulse generating circuit of FIG. 8 containing the preset circuit of FIG. 13 or the preset circuit of FIG. 15 was used, and compared with those in Example 3 (containing the preset circuit 64 of FIG. 10) with respect to laser output jitter. In each high-voltage pulse generating circuit, a magnetic core of the main saturable reactor 10 was produced by Sample Nos. 5, 11 or 13. They were operated under the same conditions as in Example 1. The magnetic cores of the presetting saturable reactors 73 in FIGS. 13, 15 were those identified as No. 22 in Table 6. In the case of the preset circuit of FIG. 13, the magnetic core was provided with 10 turns of a winding, and in the case of the preset circuit of FIG. 15, the magnetic core was provided with 10 turns of an output winding 74 and one turn of a reset winding 75 with $i_{75} = 1.0$ A.

Table 10 shows the comparison in jitter of the laser output between the preset circuits of FIGS. 10, 13 and 15.

TABLE 10

| | Jitter (ns) Measured by Using | | |
|---|---|---|---|
| Sample No. | Preset Circuit of FIG. 10 | Preset Circuit of FIG. 13 | Preset Circuit of FIG. 15 |
| 5 | ±3 | ±6 | ±3 |
| 11 | ±12 | ±18 | ±13 |
| 13 | ±3 | ±7 | ±3 |

It is clear from Table 10 that it is possible to reduce laser output jitter by using the preset circuit of FIG. 15 to substantially the same level as in the case of the preset circuit of FIG. 10. Incidentally, the limit of high-repetition operation of the preset circuit of FIG. 10 is about 300 Hz, while in the preset circuits of FIGS. 13 and 15, high-repetition operation exceeding 500 Hz can be achieved.

EXAMPLE 5

In this Example, the high-voltage pulse generating circuit of FIG. 21 containing the set circuit 164 of FIG. 32 was used. It was tested under the same conditions as in Example 1 with respect to jitter of the laser output by using samples shown in Tables 1–3 for the magnetic materials of the main saturable reactor 10. Table 11 shows the results together with those of Example 1.

TABLE 11

| | Jitter (ns) Sample | |
|---|---|---|
| No. | Example 1 | Example 3 |
| 1 | ±9 | ±2 |
| 2 | ±9 | ±2 |
| 3 | ±12 | ±3 |
| 4 | ±8 | ±2 |
| 5 | ±9 | ±2 |
| 6 | ±10 | ±3 |
| 7 | ±25 | ±8 |
| 8 | ±29 | ±8 |
| 9 | ±36 | ±9 |
| 10 | ±33 | ±8 |
| 11 | ±24 | ±7 |
| 12 | ±10 | ±2 |
| 13 | ±8 | ±2 |
| 14 | ±9 | ±2 |
| 15 | ±11 | ±3 |
| 16 | ±9 | ±2 |
| 17 | ±8 | ±2 |

It is clear from Table 11 that the circuit of this Example can reduce laser output jitter drastically. Also in this Example, by setting the maximum magnetic flux density at the time of presetting at $-Br$ or less, the laser output jitter can be reduced to about one-half that obtained when the maximum magnetic flux density is higher than $-Br$.

As described above in detail, since the high-voltage pulse generating circuit according to the present invention comprises a magnetic pulse compression circuit having a saturable reactor whose operating magnetic flux density in a gate period can be controlled, it can be operated with a controllable output at high efficiency and high repetition frequency, while suppressing the generation of output jitter.

Therefore, in discharge-excited lasers requiring a constant output control due to the deterioration of a laser gas, such as excimer lasers, the number of shots operable at a constant output can be increased drastically, while reducing the losses of switching elements such as thyratrons. Thus, a constant operation can be achieved at remarkably increased number of shots with high reliability and long service life.

In addition, in discharge-excited lasers such as copper vapor lasers used for uranium enrichment, TEMA (transversely excited multi-atmospheric pressure) lasers, etc., or accelerators such as linear induction accelerators, in which a plurality of high-voltage pulse generating circuits are operated synchronously at a high pulse-repetition rate, the output jitter should be kept minimum. According to the present invention, this requirement is met with high reliability.

Further, in cases where semiconductor elements such as thyristors are used as switching elements in place of discharge tube elements such as thyratrons, etc., multistage magnetic pulse compression circuits should be used. In such cases, the optimum operation of a magnetic pulse compression circuit in each stage should be achieved. According to the present invention, the optimum operation can be easily achieved.

What is claimed is:

1. A high-voltage pulse generating circuit comprising a magnetic pulse compression circuit having a main saturable reactor provided with a reset circuit, said reset circuit including a second saturable reactor for providing said main saturable reactor with a pulse voltage or current for setting a magnetic flux density of said main saturable reactor at a gate initiation point to a predetermined constant level, wherein said second saturable reactor blocks a voltage surge of said main saturable reactor in an unsaturated region of said second saturable reactor, and wherein said second saturable reactor is saturated by the pulse current or voltage generated in the reset circuit for setting the magnetic flux density of said main saturable reactor.

2. The high-voltage pulse generating circuit according to claim 1, wherein there is a sufficient interval for completing a self-setting action of said main saturable reactor between a period during which gate voltage is applied to the main saturable reactor and a period during which said reset circuit generates pulse voltage or current.

3. The high-voltage pulse generating circuit according to claim 1, wherein an operating magnetic flux density of said main saturable reactor can be adjusted depending upon input voltage from a dc power supply by controlling the width or intensity of pulse applied to said main saturable reactor from said reset circuit.

4. The high-voltage pulse generating circuit according to claim 1, wherein an operating magnetic flux density of said main saturable reactor can be adjusted depending upon load variation in said high-voltage pulse generating circuit by controlling the width or intensity of pulse applied to said main saturable reactor from said reset circuit.

5. A high-voltage pulse generating circuit comprising a magnetic pulse compression circuit having a main saturable reactor, a preset circuit for magnetizing said main saturable reactor to a saturation region thereof, and a set circuit for setting a magnetic flux density of said main saturable reactor at a gate initiation point to a predetermined constant level.

6. The high-voltage pulse generating circuit according to claim 5, wherein said main saturable reactor is magnetized by said preset circuit toward the saturation region which said main saturable reactor reaches in a gate period.

7. The high-voltage pulse generating circuit according to claim 5, wherein said main saturable reactor is magnetized by said preset circuit toward a different saturation region from the saturation region which said main saturable reactor reaches in a gate period.

8. The high-voltage pulse generating circuit according to claim 7, wherein said set circuit comprises a saturable reactor for setting the main saturable reactor, such that pulse voltage or current for setting a magnetic flux density of said main saturable reactor at a gate initiation point to a predetermined constant level is applied to said main saturable reactor via the second saturable reactor disposed in said set circuit.

9. The high-voltage pulse generating circuit according to claim 5, wherein said preset circuit comprises a saturable reactor for presetting said main saturable reactor, via which pulse current or voltage is applied to said main saturable reactor.

10. The high-voltage pulse generating circuit according to claim 5, wherein an operating magnetic flux density of said main saturable reactor can be adjusted depending upon input voltage from a dc power supply by controlling the width or intensity of pulse applied to said main saturable reactor from said set circuit.

11. The high-voltage pulse generating circuit according to claim 5, wherein an operating magnetic flux density of said main saturable reactor can be adjusted depending upon load variation in said high-voltage pulse generating circuit by controlling the width or intensity of pulse applied to said main saturable reactor from said set circuit.

12. A high-voltage pulse generating circuit, comprising:
a plurality of magnetic pulse compression circuits connected in series, each said magnetic pulse compression circuit including
a main saturable reactor provided with a reset circuit, said reset circuit including a second saturable reactor for providing said main saturable reactor with a pulse voltage or current for setting a magnetic flux density of said main saturable reactor at a gate initiation point to a predetermined constant level, wherein said second saturable reactor blocks a voltage surge of said main saturable reactor in an unsaturated region of said second saturable reactor, and wherein said second saturable reactor is saturated by the pulse current or voltage generated in the reset circuit for setting the magnetic flux density of said main saturable reactor 13. A high-voltage pulse generating circuit, comprising:
a plurality of magnetic pulse compression circuits connected in series, each said magnetic pulse compression circuit including
a main saturable reactor, a preset circuit for magnetizing said main saturable reactor to a saturation region thereof, and a set circuit for setting a magnetic flux density of said main saturable reactor at a gate initiation point to a predetermined constant level.

14. A discharge-excited laser comprising a high-voltage pulse generating circuit including a magnetic pulse compression circuit having a main saturable reactor provided with a reset circuit, said reset circuit including a second saturable reactor for providing said main saturable reactor with a pulse voltage or current for setting a magnetic flux density of said main saturable reactor at a gate initiation point to a predetermined constant level, wherein said second saturable reactor blocks a voltage surge of said main saturable reactor in an unsaturated region of said second saturable reactor, and wherein said second saturable reactor is saturated by the pulse current or voltage generated in the reset circuit for setting the magnetic flux density of said main saturable reactor.

15. A discharge-excited laser comprising a high-voltage pulse generating circuit comprising a magnetic pulse compression circuit having a main saturable reactor, a preset circuit for magnetizing said main saturable reactor to a saturation region thereof, and a set circuit for setting a magnetic flux density of said main saturable reactor at a gate initiation point to a predetermined constant level.

16. An accelerator comprising a high-voltage pulse generating circuit including a magnetic pulse compression circuit having a main saturable reactor provided with a reset circuit, said reset circuit including a second saturable reactor for providing said main saturable reactor with a pulse voltage or current for setting a magnetic flux density of said main saturable reactor at a gate initiation point to a predetermined constant level, wherein said second saturable reactor blocks a voltage surge of said main saturable reactor in an unsaturated region of said second saturable reactor, and wherein said second saturable reactor is saturated by the pulse current or voltage generated in the reset circuit for setting the magnetic flux density of said main saturable reactor.

17. An accelerator comprising a high-voltage pulse generating circuit comprising a magnetic pulse compression circuit having a main saturable reactor, a preset circuit for magnetizing said main saturable reactor to a saturation region thereof, and a set circuit for setting a magnetic flux density of said main saturable reactor at a gate initiation point to a predetermined constant level.

* * * * *